US008277697B2

(12) United States Patent
Royster, Jr. et al.

(10) Patent No.: US 8,277,697 B2
(45) Date of Patent: *Oct. 2, 2012

(54) COLOR FILTER ELEMENT WITH IMPROVED COLORANT DISPERSION

(75) Inventors: Tommie L. Royster, Jr., Rochester, NY (US); Paula J. Alessi, Rochester, NY (US); Donald R. Diehl, Rochester, NY (US)

(73) Assignee: Global Oled Technology LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/260,195

(22) Filed: Oct. 29, 2008

(65) Prior Publication Data

US 2010/0102283 A1    Apr. 29, 2010

(51) Int. Cl.
*G02B 5/23* (2006.01)
*C09B 67/50* (2006.01)
*G03B 41/02* (2006.01)

(52) U.S. Cl. ............ 252/586; 106/31.08; 106/410; 349/106; 349/149; 427/162; 524/88; 540/136; 540/140

(58) Field of Classification Search ......... 106/410, 106/411, 412, 413, 31.8; 524/88; 540/136, 540/137, 140; 359/885; 427/162; 252/586; 349/106, 149
See application file for complete search history.

(56) References Cited

U.S. PATENT DOCUMENTS

| | | |
|---|---|---|
| 2,227,628 A | 7/1941 | Calcott |
| 2,925,423 A | 2/1960 | Weinmayr |
| 4,209,458 A | 6/1980 | Keller et al. |
| 4,311,775 A * | 1/1982 | Regan ............... 430/37 |
| 4,382,033 A | 5/1983 | Regan |
| 4,548,610 A | 10/1985 | Preiswerk et al. |
| 4,597,794 A | 7/1986 | Ohta et al. |
| 4,701,396 A | 10/1987 | Hung et al. |
| 4,892,941 A | 1/1990 | Dolphin et al. |
| 5,085,698 A | 2/1992 | Ma et al. |
| 5,145,684 A | 9/1992 | Liversidge et al. |
| 5,172,133 A | 12/1992 | Suga et al. |
| 5,279,654 A | 1/1994 | Keirs et al. |
| 5,324,349 A | 6/1994 | Sano et al. |
| 5,405,709 A | 4/1995 | Littman et al. |
| 5,441,837 A | 8/1995 | Ong et al. |
| 5,466,796 A | 11/1995 | Burt et al. |
| 5,500,331 A | 3/1996 | Czekai et al. |
| 5,614,342 A | 3/1997 | Molaire et al. |
| 5,679,138 A | 10/1997 | Bishop et al. |
| 5,679,139 A | 10/1997 | McInerney et al. |
| 5,679,142 A | 10/1997 | McInerney et al. |
| 5,683,823 A | 11/1997 | Shi et al. |
| 5,738,716 A | 4/1998 | Santilli et al. |
| 5,763,189 A | 6/1998 | Buechler et al. |
| 5,773,181 A | 6/1998 | Molaire et al. |
| 5,817,805 A | 10/1998 | Gruenbaum et al. |
| 5,968,688 A * | 10/1999 | Masuda et al. ............... 430/7 |
| 5,972,089 A | 10/1999 | Martin |
| 6,051,702 A | 4/2000 | Bird et al. |
| 6,152,999 A | 11/2000 | Erdtmann et al. |
| 6,153,000 A | 11/2000 | Erdtmann et al. |
| 6,238,931 B1 | 5/2001 | Buechler et al. |
| 6,392,340 B2 | 5/2002 | Yoneda et al. |
| 6,511,971 B1 | 1/2003 | Gorun |
| 6,713,227 B2 | 3/2004 | Machiguchi et al. |
| 6,715,869 B1 | 4/2004 | Reem et al. |
| 6,726,755 B2 | 4/2004 | Titterington et al. |
| 6,733,934 B2 | 5/2004 | Machiguchi et al. |
| 6,770,405 B2 | 8/2004 | Ueda et al. |
| 6,856,364 B2 | 2/2005 | Yamashita et al. |
| 6,949,139 B2 | 9/2005 | Molaire et al. |
| 6,964,844 B1 | 11/2005 | Buechler et al. |
| 7,008,742 B2 | 3/2006 | Molaire |
| 7,083,984 B2 | 8/2006 | Buechler et al. |
| 7,382,514 B2 | 6/2008 | Hsu et al. |
| 2002/0117080 A1* | 8/2002 | Okutsu et al. ............. 106/31.78 |
| 2003/0027893 A1 | 2/2003 | Campbell et al. |
| 2003/0151708 A1 | 8/2003 | Funakura et al. |
| 2004/0030125 A1 | 2/2004 | Li et al. |
| 2004/0105265 A1 | 6/2004 | Takizawa |
| 2005/0159595 A1 | 7/2005 | Molaire |
| 2005/0272831 A1 | 12/2005 | Wang et al. |
| 2006/0014855 A1 | 1/2006 | House et al. |
| 2006/0070651 A1 | 4/2006 | Kang et al. |
| 2006/0098316 A1 | 5/2006 | Tatsuzawa et al. |
| 2006/0112856 A1 | 6/2006 | Brychcy et al. |
| 2006/0204885 A1 | 9/2006 | Molaire et al. |
| 2007/0166547 A1* | 7/2007 | Dobbertin et al. ......... 428/411.1 |
| 2008/0112068 A1* | 5/2008 | Helber et al. ............... 359/885 |
| 2008/0112069 A1 | 5/2008 | Helber et al. |

FOREIGN PATENT DOCUMENTS

| | | |
|---|---|---|
| CN | 1150261 | 5/1997 |
| CN | 101081942 | 12/2007 |
| DE | 197 35 738 | 7/2004 |
| EP | 498492 | 8/1992 |
| EP | 0 833 203 A1 | 4/1998 |
| EP | 0 889 097 | 6/2005 |
| EP | 1 577 350 A1 | 9/2005 |

(Continued)

OTHER PUBLICATIONS

*App. Physics Letters*, vol. 75, No. 7, Aug. 16, 1999, pp. 888-890, Deshpande et al, "White Light Emitting Organic Electroluminescent devices based on interlayer sequential energy transfer".

(Continued)

*Primary Examiner* — Bijan Ahvazi

(74) *Attorney, Agent, or Firm* — McKenna Long & Aldridge LLP

(57) ABSTRACT

A color filter having a filter layer comprising a fluorinated phthalocyanine pigment and at least one second pigment. In one embodiment, the second pigment has a maximum absorption at a wavelength from 400 to 500 nm to create a green color filter.

12 Claims, 6 Drawing Sheets

FOREIGN PATENT DOCUMENTS

| | | |
|---|---|---|
| JP | 07-142169 | 6/1995 |
| JP | 2003-241374 | 8/2003 |
| JP | 2004-027016 A | 1/2004 |
| JP | 2005-298490 A | 10/2005 |
| JP | 2007/321107 | 12/2007 |
| JP | 2007/321110 | 12/2007 |
| JP | 2007/321111 | 12/2007 |
| WO | 87/07267 | 12/1987 |
| WO | WO 02/14912 A1 | 2/2002 |
| WO | 2005/033110 | 4/2005 |
| WO | WO 2005/047962 | 5/2005 |
| WO | WO 2007/088662 | 8/2007 |
| WO | WO 2008/063350 A1 | 5/2008 |

OTHER PUBLICATIONS

*App.Physics Letter*, 65, vol. 7, Feb. 14, 1998, pp. 815-817, Kido et al, "White Light emitting Organic electroluminescent devices using poly(N-vinycarbazole) emitter layer doped with three fluorescent dyes".

*J.Photopolym.Sci. Tech.*, vol. 9, No. 1 (1996) pp. 109-120, Takanori Kudo et al.

*Jpn. J. Appl. Phys.*, vol. 37 (1998) Pt. 1, No. 6A, pp. 3594-3603, Takanori Kudo et al.

"Liquid Crystal Displays", Ernst Lueder ed., John Wiley & Sons, Ltd. (2001), pp. 288-289 & 292-295.

"High Performance Pigments", Hugh M. Smith, John Wiley & Sons, pp. 264-265.

*J.of the SID*, 1/3, (1993), pp. 341-346, Takeo Sugiura, "Development of pigment-dispersed-type color filters for LCDs".

*Science*, vol. 267, Mar. 3, 1995, pp. 1332-1334, "Multilayer White Light-Emitting Organic Electroluminescent Device", Junji Kido et al.

*J.FluorineChem*, vol. 12 (1978) pp. 73-77, "The Synthesis of A. Fluorinated Phthalocyanine" Keller et al.

*SPIE* vol. 3560, Fu et al., Pigment-Dispersed Resists for Color Filters pp. 116-121.

*Inorganic Chemistry*, vol. 8, 2018 (1969), Jones et al., "A Fluorinated Iron Phthalocyanine".

*J.App.Physics*, vol. 93, No. 12 (2003) pp. 9683-9692.

*Color Television Standards*, Fink, McGraw-Hill (1995) pp. 102-246.

American Chemical Society, Langmuir 1999, 15, pp. 5227-5231, Hughes et al., "Stability of Copper Phthalocyanine Dispersions in Organic Media".

Database WPI, Section Ch, Week 200241, Thomson Scientific, Longdon, GB; AN 2002-382657; XP002595869, pp. 1-4.

* cited by examiner

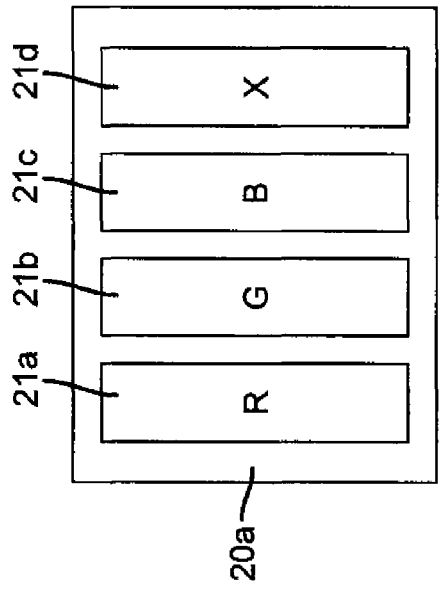
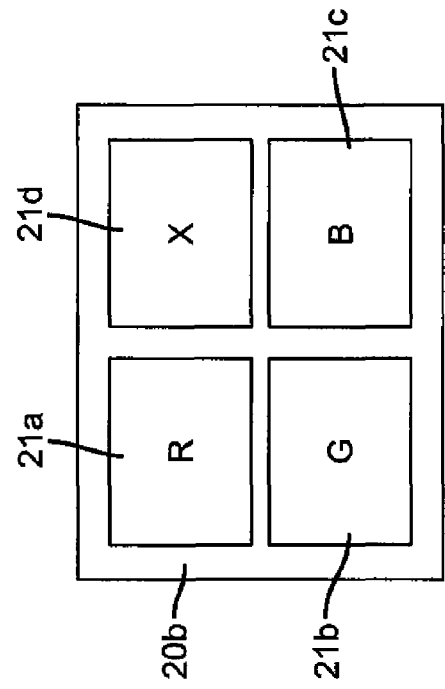
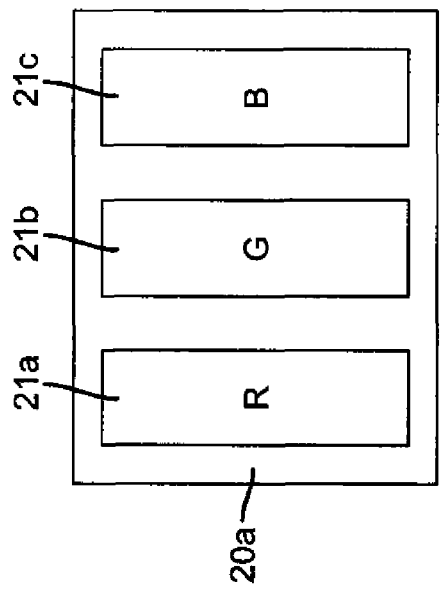
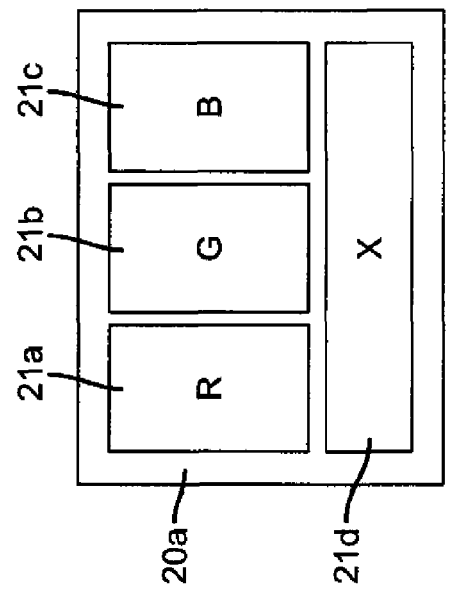

COLOR FILTER ELEMENT WITH IMPROVED COLORANT DISPERSION

CROSS REFERENCE TO RELATED APPLICATIONS

Reference is made to commonly assigned U.S. patent application Ser. No. 11/595,615 (published as US20080112068) filed Nov. 10, 2006 entitled "Green Color Filter Element" by Helber et al, U.S. patent application Ser. No. 11/595,198 filed Nov. 10, 2006 entitled "Blue Color Filter Element" by Helber et al and U.S. patent application Ser. No. 11/595,199 (published as US2008011069) filed Nov. 10, 2006 entitled "Display with RGB Color Filter Element Sets" by Helber et al., U.S. patent application Ser. No. 12/260, 127 filed Oct. 29, 2008 (now U.S. Pat. No. 7,585,363) entitled "Method for Preparing Nanodispersions of Fluorinated Phthalocyanne Pigments" by Royster et al. and U.S. patent application Ser. No. 12/260,344 filed Oct. 29, 2008 (now U.S. Pat. No. 7,628,849) entitled "Fluorinated Bis-(Phthalocyanylaluminoxy)Silyl Pigments" by Diehl et al., and the disclosure of which are incorporated herein by reference.

FIELD OF THE INVENTION

The present invention relates to color filters for electronic displays.

BACKGROUND OF THE INVENTION

In recent years, it has become necessary that electronic image display devices have high-resolution and high picture quality, and it is desirable for such image display devices to have low power consumption and be thin, lightweight, and visible from wide angles. With such requirements, display devices (displays) have been developed where thin-film active elements (thin-film transistors, also referred to as TFTs) are formed on a glass substrate, with display elements (for example, organic light-emitting diode layers to produce light, or liquid-crystal layers to block light from a backlight) then being formed on top.

A problem with displays combining white-emitting devices with color filters is that the combination of emitter and color filters must provide a good color gamut for the reproduction of a wide range of colors. Color filters used in this way must have good spectroscopic characteristics, with sufficient transmittance with the predetermined visible light region and no unnecessary transmittance in other regions of the visible spectrum.

Much work has been done to identify good color filters and color filter combinations for liquid crystal displays (LCD), e.g. "Liquid Crystal Displays", Ernst Leudner ed., John Wiley & Sons (2001), pp. 287-296; "High Performance Pigments", Hugh M. Smith, John Wiley & Sons, pp. 264-265; Kudo et al., *Jpn. J. Appl. Phys.*, 37 (1998), pp. 3594-3603; Kudo et al., *J. Photopolymer Sci. Tech.* 9 (1996), pp. 109-120; Sugiura, *J. of the SID,* 1(3) (1993), pp. 341-346; FU et al., SPIE, Vol. 3560, pp. 116-121; Ueda et al., U.S. Pat. No. 6,770,405; and Machiguchi et al. U.S. Pat. Nos. 6,713,227 and 6,733,934.

Despite such improvements, display color reproduction has remained fill of compromises. For example, the standards for color television gamut, as defined by the National Television Standards Committee (NTSC) and described by Fink in "Color Television Standards", McGraw-Hill, New York (1955), and in Recommendation ITU-R BT.709-5, "Parameter values for the HDTV standards for production and international programme exchange", have seldom been met. The former NTSC reference describes a good red primary as having 1931 CIE x,y chromaticity coordinates of x=0.67 and y=0.33, while a good green primary has coordinates of x=0.21 and y=0.71. The latter HDTV reference defines a good blue primary as the original PAL/SECAM blue having coordinates of x=0.15 and y=0.06. Commercially available televisions fall short of these standards and have a compromised color gamut. Takizawa, in US 2004/0105265, teaches a red filter that can achieve an x value as high as 0.65 and a y value as high as 0.33, which falls short of the NTSC reference red primary in x. Yamashita, in U.S. Pat. No. 6,856,364, teaches a red filter that can achieve an x value as high as 0.665 and a y in the range from 0.31 to 0.35. While this is an improvement over Takizawa, a red primary that meets or exceeds the x value of the NTSC primary would result in a purer red color. Yamashita further teaches a blue filter wherein the x value can range from 0.13 to 0.15 and the y value can only be as low as 0.08 and a green filter wherein the x value can range from 0.22 to 0.34 with a y value ranging from 0.56 to 0.65. Both of these fall short of the respective desired primary x,y values, which if achieved would result in purer blue and green colors, respectively.

Additionally, liquid crystal displays commonly available often use a backlight such as a cold-cathode fluorescent light (CCFL). It is a characteristic of CCFL sources commonly available that, while it provides white light consisting of a variety of wavelengths of the visible spectrum, the light is often more intense in a few narrow bands of the spectrum. These bands are generally centered in the red, the green, and the blue regions of the spectrum. The color filters needed with such light sources do not need to be especially narrow to provide a good color gamut. For example, a red filter can permit a transmittance "tail" into parts of the green region of the spectrum, so long as the tail region does not include the major green emission peak, and still provide good color with such a light source.

Organic light-emitting diodes (OLEDs) provide another light source for displays. Unlike LCDs, which have a single fall-display light source, OLED displays only produce light at the pixels that are required to be bright at a given time. Therefore, it is possible for OLED devices to provide displays that have reduced power requirements under normal usage. There has been much interest in broadband-emitting OLED devices in color displays. Each pixel of such a display is coupled with a color filter element as part of a color filter array (CFA) to achieve a pixilated multicolor display. The broadband-emitting structure is common to all pixels, and the final color as perceived by the viewer is dictated by that pixel's corresponding color filter element. Therefore, a multicolor or ROB device can be produced without requiring any patterning of the emitting structure. An example of a white CFA top-emitting device is shown in U.S. Pat. No. 6,392,340. Kido et al., in *Science,* 267, 1332 (1995) and in *Applied Physics Letters,* 64, 815 (1994), Littman et al. in U.S. Pat. No. 5,405, 709, and Deshpande et al., in *Applied Physics Letters,* 75, 888 (1999), report white-light-producing OLED devices. Other examples of white light producing OLED devices have been reported in U.S. Pat. No. 5,683,823 and JP 07-142169.

Phthalocyanine pigments, particularly copper phthalocyanine, are solid materials that are relatively insoluble and are used to impart red absorbance or blue-green transmittance in color filters for electronic devices. Bridged aluminum phthalocyanines have been proposed as an improved cyan or bluegreen pigment in green color filters, see US 20080112068. US 20020117080 discloses pigments consisting of mixtures of copper and aluminum phthalocyanines where the phthalocyanine groups have been randomly chlorinated or brominated.

U.S. Pat. No. 4,311,775 discloses bis-aluminum phthalocyanines that are bridged with one or more siloxane groups as useful pigments for electrographical and photoelectrographic process. U.S. Pat. No. 5,817,805 discloses a synthetic method for the preparation of bis(phthalocyanylalumino)tetraphenyldisiloxanes, including those in which the phthalocyanine group can contain halo groups. U.S. Pat. No. 5,773,181 discloses the preparation of mixtures of fluoro and alkyl substituted metal phthalocyanines where the metal can be aluminum or copper.

U.S. Pat. No. 4,701,396 discloses unbridged titanyl fluorophthalocyanines. Other references that disclose fluorinated titanyl phthalocyanines are U.S. Pat. No. 6,949,139, U.S. Pat. No. 5,614,342 and US 20060204885. US20040030125 discloses silyl phthalocyanines including bridged bis-species and where the phthalocyanine groups contain low molecular weight fluorinated polymeric moieties.

Fluorinated non-metal phthalocyanines or unbridged metal phthalocyanines have also been disclosed in Jones et al, Inorg. Chem., Vol 8, 2018(1969); Keller et al, J. Fluorine Chem., 13, 73(1975); Peisert et al, J. Appl. Physics, 93(12), 9683(2003); U.S. Pat. No. 6,051,702; U.S. Pat. No. 4,892, 941; U.S. Pat. No. 2,227,628 and WO2005033110. Methods for making fluorinated phthalonitriles, often used as a precursor to the phthalocyanine group, include U.S. Pat. No. 4,209, 458 and WO1987007267.

However, it can be difficult to form high concentrated organic solvent dispersions of phthalocyanine pigments with small particle size and narrow particle size distribution that permit the preparation of color filters with high transmittance in desired regions. Therefore, it is a problem to be solved to produce color filters that can be coupled with broadband electronic displays, particularly broadband OLED devices, to provide displays with improved color rendition.

SUMMARY OF THE INVENTION

It is therefore an object of the present invention to provide a color filter to provide improved color rendition, particularly with a broadband-emitting electronic display device and a display containing the filter. Improved color rendition includes increased transmittance, improved luminance and related properties such as improved 1931 CIE x,y chromaticity coordinates and improved spectral curve shape. This object is achieved by a color filter comprising a mixture of a fluorinated phthalocyanine pigment having a maximum absorbance between 600-700 nm and at least one second pigment with a maximum absorbance less than 620 nm. One desirable embodiment is a green color filter where the second pigment has its maximum absorption at a wavelength from 400 to 500 nm. In particular, this object is achieved by a green color filter comprising a fluorinated phthalocyanine pigment having its maximum absorption at a wavelength from 600 to 700 nm filter layer wherein at least 85 volume % of the pigment particles have a is particle size less than 2750 nm and preferably where at least 80 volume % have a particle size of less than 100 nm. Desirably, the green filter layer has a transmittance of 60% or more at a wavelength of 520 nm, of no more than 10% at a wavelength of 590 nm and of no more than 10% at a wavelength of 480 nm. Moreover, the green color filter should have chromaticity coordinates (x,y) in the 1931 CIE XYZ colorimetric system, calculated using CIE Standard Illuminant C, that satisfies the expressions $0.19 \leq x \leq 0.21$ and $0.69 \leq y \leq 0.71$ as well as a greater % luminance at the same chromaticity coordinates than a green color filter prepared in identical manner using the analogous non-fluorinated phthalocyanine pigment.

ADVANTAGES

It is an advantage of this invention that it can produce color displays with an improved combination of color and luminance relative to existing displays by utilizing highly concentrated dispersions of fluorinated phthalocyanines. Concentrated dispersions of fluorinated phthalocyanines can be prepared in organic solvents, which are easy to remove in the process of manufacturing color filters, and have small particle size and narrow particle size distribution which minimize scatter, leading to improved transmittance. Thus, this invention can provide greater luminance at the target NTSC chromaticity position and thus better overall rendition of colors while improving manufacturability and lowering cost.

BRIEF DESCRIPTION OF THE DRAWINGS

FIGS. 1a to 1d show example pixel configurations that can be used for an electronic display using this invention.

Figure 2A:
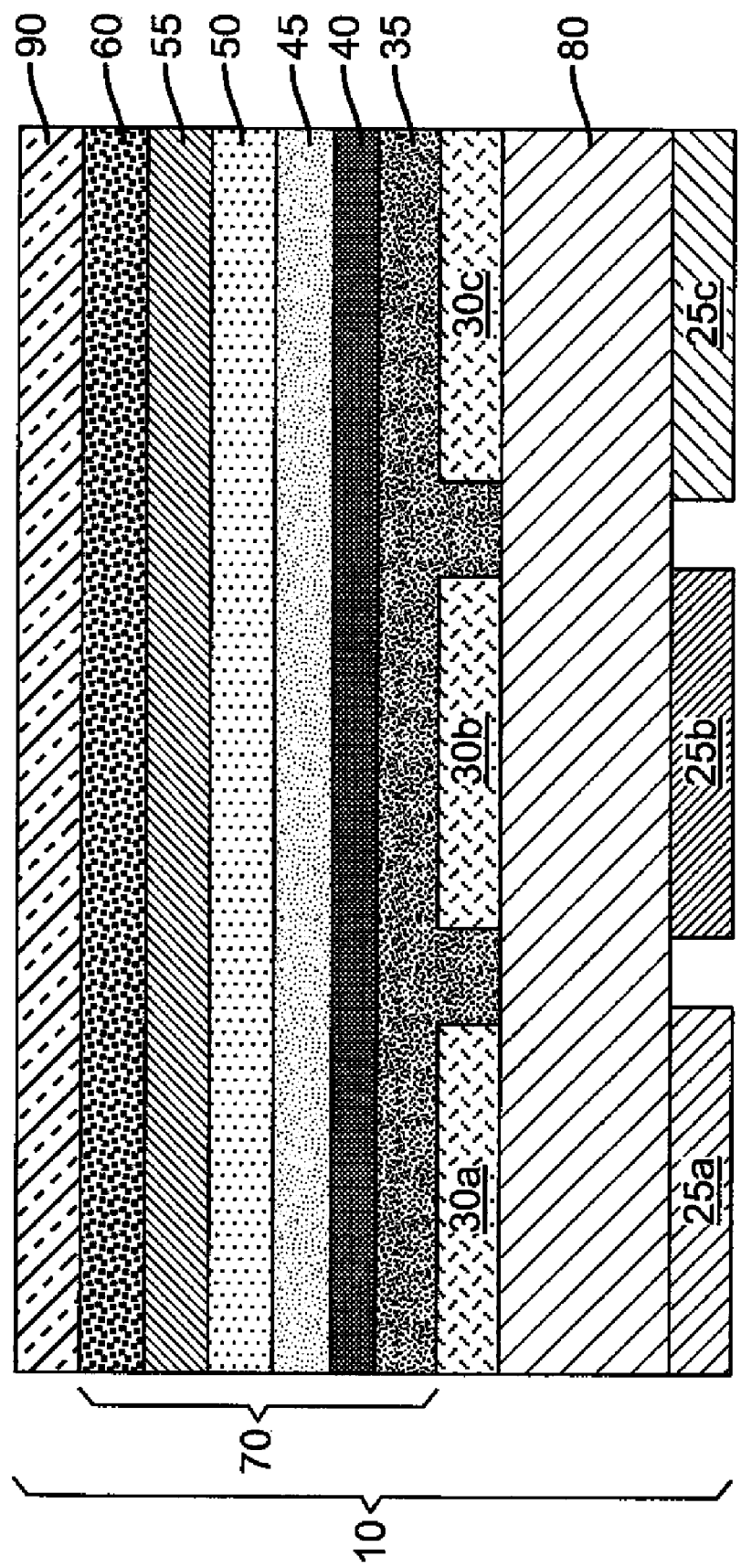
FIG. 2a shows a cross-sectional view of one embodiment of an electronic display that can be used with this invention.

Since device feature dimensions such as layer thicknesses are frequently in sub-micrometer ranges, the drawings are scaled for ease of visualization rather Dan dimensional accuracy.

DETAILED DESCRIPTION OF THE INVENTION

The term "electronic display" refers to a display wherein electronic entities control the intensity of the different areas of the display. Such electronic entities can include e.g. an off-panel driver and a series of horizontal and vertical electrodes in a passive-matrix display, or an array of thin-film transistors (TFTs) in an active-matrix display. Such displays can include liquid crystal displays (LCDs) and organic light-emitting-diode (OLED) displays. The term "OLED display", "OLED device" or "organic light-emitting display" is used in its art-recognized meaning of a display device comprising organic light-emitting diodes as pixels. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in at least the red, green, and blue regions of the visible spectrum and displaying images in any combination of hues. The complete set of colors that can be generated by a given display is commonly called the color gamut of the display. The red, green, and blue colors constitute the three primary colors from which all other colors can be generated by appropriate mixing. However, the use of additional colors that are within the color gamut of the device or additional colors to extend the color gamut of the device is possible. The term "hue" refers to the wavelength profile of light emission within the visible spectrum, with different hues exhibiting visually discernible differences in color. The term "pixel" is employed in its art-recognized usage to designate an area of a display panel that can be stimulated to emit light independently of other areas. It is recognized that in full-color systems, several pixels of different colors will be used together to generate a broad range of colors, and a viewer can term such a group a single pixel. For the purposes of this discussion, such a group will be considered several different colored pixels.

The terms "maximum absorption" and "maximum transmittance" as used herein refer to the maximum light absorption and maximum light transmittance, respectively, of color filters and color filter layers within the visible portion of the spectrum, i.e. from 400 nm to 700 nm. Red color filters are color filters that have a maximum transmittance substantially in the range of 600 nm to 700 nm. Green color filters are color filters that have a maximum transmittance substantially in the range of 500 nm to 600 nm. Blue color filters are color filters that have a maximum transmittance substantially in the range of 400 nm to 500 nm.

FIG. 1 illustrates example pixel configurations that can be used for an electronic display using this invention. FIG. 1a shows a stripe pattern configuration of a device with group of pixels 20a. Group of pixels 20a includes red, green, and blue color-gamut-defining pixels 21a, 21b, and 21c. FIG. 1a is a common example of an RGB display. FIG. 1b shows a configuration of a device with group of pixels 20a including red, green, and blue color-gamut-defining pixels 21a, 21b, and 21c as well as extra pixel 21d, which can be a within-gamut pixel (e.g. white) or can be another color-gamut-defining pixel. One common arrangement utilizing FIG. 1b is an RGBW display, wherein portions of the display, e.g. within-gamut pixel 21d, would not have a color filter. FIG. 1c shows another pattern configuration of a device with group of pixels 20a. FIG. 1d shows another pattern configuration of a device with group of pixels 20b. Other patterns can also be applied to the present invention, including patterns with more than 4 pixels. While in the above-mentioned examples, the pixels are shown to be arranged in a certain order, the pixels can be arranged in other embodiments having different orders, and other embodiments can have pixels with differing sizes and shapes.

There are numerous configurations of color filters and displays with which this invention can be practiced. Turning now to FIG. 2a, there is shown a cross-sectional view of one embodiment of a bottom-emitting electronic display 10 that can be used with this invention. Electronic display 10 is an OLED is device well known in the art. An organic electroluminescent (EL) element 70, comprising hole-injecting layer 35, hole-transporting layer 40, light-emitting layers 45 and 50, electron-transporting layer 55, and electron-injecting layer 60, is provided over an OLED substrate 80. Current is provided by cathode 90 and anodes 30a, 30b, and 30c. The display includes at least three separate filters, e.g. red color filter 25a, green color filter 25b, and blue color filter 25c, each of which is a separate emitting unit with its own anode 30a, 30b, and 30c, respectively.

Figure 2B:
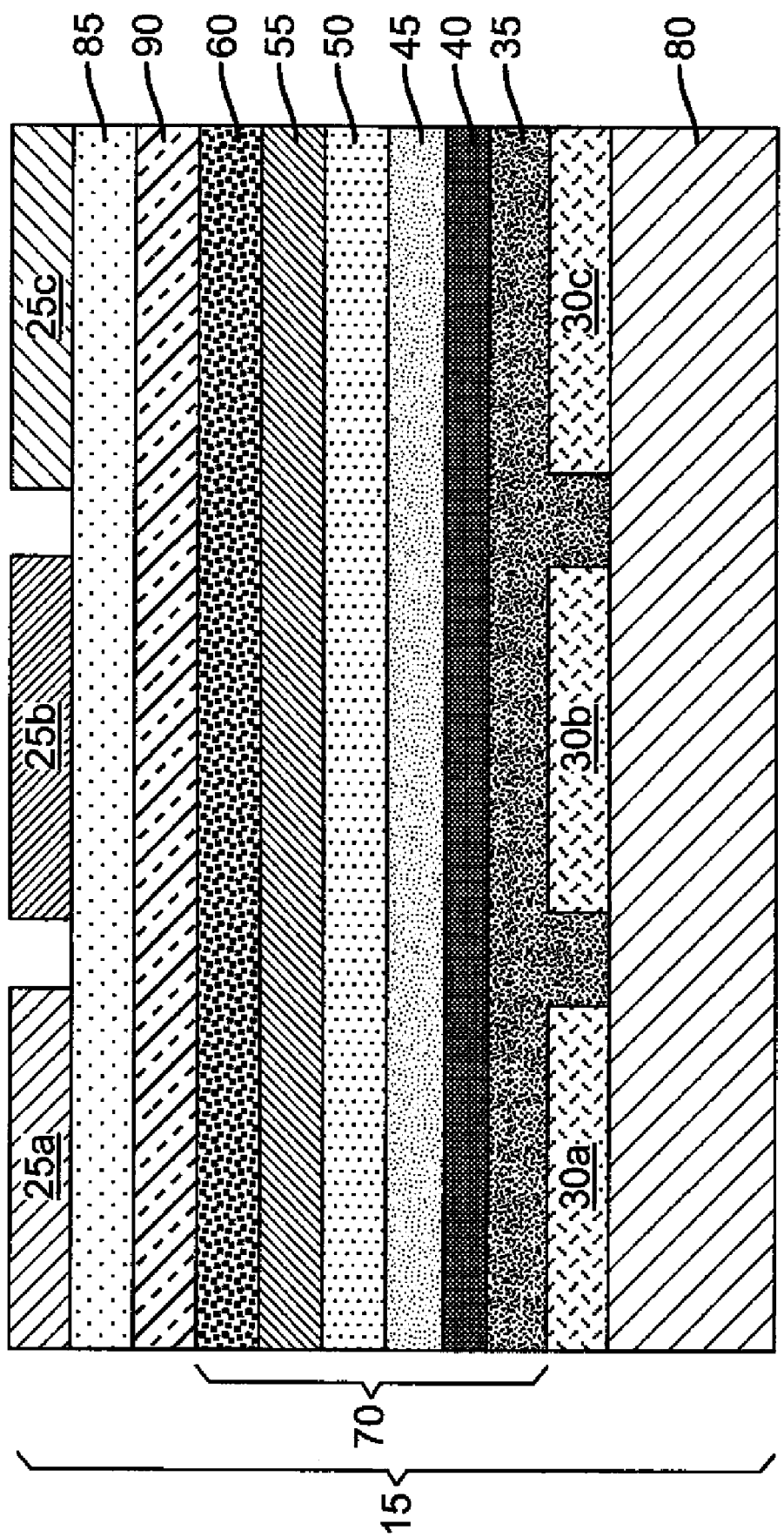
FIG. 2b shows another embodiment of an electronic display that can be used with this invention.

Color filters are often provided on a substrate. In FIG. 2a, the substrate is also the device substrate 80. Turning now to FIG. 2b, there is shown another embodiment of an electronic display with color filters. Electronic display 15 is a top-emitting device. Color filters 25a, 25b, and 25c have been provided on a separate color filter substrate 85 that is placed over the electronic display after the electronic and emissive layers are provided. It will be understood that other arrangements of color filters commonly known in the art can be used with this invention. Further, other embodiments of electronic displays can be used, e.g. tandem OLED devices or liquid crystal displays.

Color Filter Pigment Preparation

The milling that has been used in the prior art for color filter pigments commonly produces material with a wide range of particle sizes up to 500 nm. It has been found that fluorinated phthalocyanine pigment particles readily mill to a narrow particle size range, where the particle size is predominantly less than 100 nm, yielding improved color filter properties. A method for producing particles of this type has been taught by Santilli et al. in U.S. Pat. No. 5,738,716, and by Czekai et al. in U.S. Pat. No. 5,500,331, the contents of which are incorporated herein by reference. This method will be referred to herein as micromedia milling (for example, see the experimental preparation of the dispersion of PY185).

The process of preparing color filters from pigments commonly involves three steps: (a) a dispersing or milling step to break up the pigment to a dispersion of the primary particle; (b) a dilution or a mixing step in which the dispersed pigment concentrate is diluted with a carrier and other addenda, which can include other pigment dispersions, to a coating-strength pigment dispersion; and (c) coating a color filter layer from the coating-strength pigment dispersion onto a substrate. Step (a) can be further detailed as: (a1) providing a pigment mixture containing a pigment and a carrier for the pigment, and optionally a dispersant; (a2) mixing the pigment mixture with milling media; (a3) introducing the mixture into a high-speed mill; (a4) milling the mixture to obtain a pigment dispersion wherein the pigment particles have the desired size; and (a5) separating the dispersion from the milling media.

In the milling step, the pigment is usually suspended in a carrier (typically the same carrier as that in the coating-strength slurry) along with rigid, inert milling media. Mechanical energy is supplied to this pigment dispersion, and the collisions between the milling media and the pigment cause the pigment to deaggregate into its primary particles and fracture primary particles into smaller particles. A dispersant or stabilizer, or both, is commonly added to the pigment dispersion to facilitate dispersing smaller particles of the raw pigment, and to maintain colloidal particle stability, i.e. retarding particle reaggregation and settling.

There are many different types of materials which can be used as milling media, such as glasses, ceramics, metals, and plastics. In a useful embodiment, the grinding media can comprise particles, preferably substantially spherical in shape, e.g., beads, consisting essentially of a polymeric resin. Desirably the beads have sizes in the range of 10 to 100 microns, as described by Czekai et al.

In general, polymeric resins suitable for use as milling media are chemically and physically inert, substantially free of metals, solvent, and monomers, and of sufficient hardness and friability to enable them to avoid being chipped or crushed during milling. Suitable polymeric resins include crosslinked polystyrenes, such as polystyrene crosslinked with divinylbenzene, styrene copolymers, polyacrylates such as poly(methyl methylacrylate), polycarbonates, polyacetals, such as Derlin™, vinyl chloride polymers and copolymers, polyurethanes, polyamides, poly(tetrafluoroethylenes), e.g., Teflon™, and other fluoropolymers, high density polyethylenes, polypropylenes, cellulose ethers and esters such as cellulose acetate, polyhydroxyethyl methacrylate), poly(hydroxyethyl acrylate), silicone containing polymers such as polysiloxanes and the like. The polymer can be biodegradable. Exemplary biodegradable polymers include polylactides, polyglycolids, copolymers of lactides and glycolide, polyanhydries, poly(imino carbonates), poly(N-acylhydroxyproline)esters, poly(N-palmitoyl hydroxyprolino)esters, ethylene-vinyl acetate copolymers, poly(orthoesters), poly(caprolactones), and poly(phosphazenes). The polymeric resin can have a density from 0.9 to 3.0 g/cm$^3$. Higher density resins are especially useful inasmuch as these resins transfer more energy to provide more efficient particle size reduction. Especially useful are crosslinked or uncrosslinked polymeric media based on styrene.

Milling can take place in any suitable grinding mill. Suitable mills include an airjet mill, a roller mill, a ball mill, an attritor mill, a vibratory mill, a planetary mill, a sand mill, and a bead mill. A high speed mill is particularly useful. By high speed mill we mean milling devices capable of accelerating milling media to velocities greater than about 5 meters per second. The mill can contain a rotating shaft with one or more impellers. In such a mill the velocity imparted to the media is approximately equal to the peripheral velocity of the impeller, which is the product of the impeller revolutions per minute, $\pi$, and the impeller diameter. Sufficient milling media velocity is achieved, for example, in Cowles-type saw tooth impeller having a diameter of 40 mm when operated at 9,000 rpm. Useful proportions of the milling media, the pigment, the liquid dispersion medium and dispersant can vary within wide limits and depends, for example, upon the particular material selected and the size and density of the milling media. The process can be carried out in a continuous or batch mode.

In one type of batch milling, a slurry of <100 μm polymeric resin milling media, liquid, pigment, and dispersant is prepared using simple mixing. This slurry can be milled in conventional high energy batch milling processes such as high speed attritor mills, vibratory mills or ball mills. This slurry is milled for a predetermined length of time to permit comminution of the active material to a minimum particle size. After milling is complete, the dispersion of active material is separated from the milling media by a simple sieving or filtration with a barrier to the milling media but not the milled pigment, e.g. a filter with a pore size of 5 μm.

In one type of continuous media recirculation milling, a slurry of <100 μm polymeric resin milling media, liquid, pigment, and dispersant can be continuously recirculated from a holding vessel through a conventional media mill which has a media separator screen adjusted to >100 μm to permit free passage of the media throughout the circuit. After milling is complete, the dispersion of active material is separated from the milling media by simple sieving or filtration.

With either of the above modes, the useful amounts and ratios of the ingredients of the mill grind will vary widely depending upon the specific materials. The contents of the milling mixture comprise the mill grind and the milling media. The mill grind comprises pigment, dispersant and a liquid carrier such as water or organic solvents. For filter slurries, the pigment is usually present in the mill grind at 1 to 50 weight %, excluding the milling media. The weight ratio of pigment to dispersant is 20:1 to 1:2. The high speed mill is a high agitation device, such as those manufactured by Morehouse-Cowles, Hockmeyer et al.

The dispersant is another important ingredient in the mill grind. Useful dispersants include Solsperse 41000 (The Lubrizol Corporation) or other compositions sold under the Solsperse brand name, sulfates (e.g. sodium dodecyl sulfate), sulfonates (e.g. N-methyl-N-oleoyl taurate), acrylic and styrene-acrylic copolymers such as those disclosed in U.S. Pat. Nos. 5,085,698 and 5,172,133 (e.g. Joncryl 678), and sulfonated polyesters and styrenics such as those disclosed in U.S. Pat. No. 4,597,794. Also useful are phosphorated polyesters such as Disperbyk-111 (BYK-Chemie GmbH, Germany) and Disperbyk-161 (BYK-Chemie GmbH, Germany) which contains amine functional groups or dispersion agents that contain polyether functional groups. Other patents referred to above in connection with pigment availability also disclose a wide variety of useful dispersants.

The milling time can vary widely and depends upon the pigment, mechanical structure, residence conditions, along with the initial and desired final particle size. For aqueous mill grinds using the useful pigments, dispersants, and milling media described above, milling times will typically range from 1 to 100 hours. The milled pigment concentrate is conveniently separated from the milling media by filtration.

The carrier for the pigment can be an aqueous carrier medium or a non-aqueous solvent. Useful solvents have been disclosed by Czekai et al., and also in U.S. Pat. No. 5,145,684, U.S. Pat. No. 5,679,138, and EP 498,492, the disclosures of which are incorporated herein by reference. The aqueous carrier medium is water, an aqueous salt solution, or an aqueous solvent mixture comprising water and at least one water-miscible co-solvent. Selection of a suitable mixture depends on requirements of the specific application, such as desired surface tension and viscosity, the selected pigment, drying time of the color filter layer, and the type of material onto which the pigment dispersion will be coated. Representative examples of water-miscible co-solvents that can be selected include (1) alcohols, such as methyl alcohol, ethyl alcohol, n-propyl alcohol, isopropyl alcohol, n-butyl alcohol, sec-butyl alcohol, t-butyl alcohol, iso-butyl alcohol, furfuryl alcohol, and tetrahydrofurfuryl alcohol; (2) ketones or ketoalcohols such as acetone, methyl ethyl ketone, and diacetone alcohol; (3) ethers, such as tetrahydrofuran and dioxane; (4) esters, such as ethyl acetate, ethyl lactate, ethylene carbonate, and propylene carbonate; (5) polyhydric alcohols, such as ethylene glycol, diethylene glycol, triethylene glycol, propylene glycol, tetraethylene glycol, polyethylene glycol, glycerol, 2-methyl-2,4-pentanediol, 1,2,6-hexanetriol, and thioglycol; (6) lower alkyl mono- or di-ethers derived from alkylene glycols, such as ethylene glycol mono-methyl (or -ethyl) ether, diethylene glycol mono-methyl (or -ethyl) ether, propylene glycol mono-methyl (or -ethyl) ether, triethylene glycol mono-methyl (or -ethyl) ether, and diethylene glycol di-methyl (or -ethyl) ether; (7) nitrogen containing cyclic compounds, such as pyrrolidone, N-methyl-2-pyrrolidone, and 1,3-dimethyl-2-imidazolidinone; and (8) sulfur-containing compounds such as dimethyl sulfoxide and tetramethylene sulfone.

Useful non-aqueous solvents include ketones, hydrocarbons, alcohols, polyols, ethers, and esters. Of these, ketones and esters are preferred. Solvents known to be useful for this process include toluene, hexane, cyclohexanone, ethanol, butanol, glycol, and PGMEA (propylene glycol monomethyl ether acetate). A single solvent or mixtures of solvents may be used. A particularly suitable solvent mixture is cyclohexanone and PGMEA.

The fluorinated phthalocyanine pigments of the invention are exceptionally useful with non-aqueous organic solvents. In organic solvents, fluorinated phthalocyanine pigments readily mill to small particle sizes with a narrow particle size distribution.

This treatment results in pigment particles wherein at least 85 volume % of the particles have a particle size less than 2750 nm. It is very suitable that at least 80 volume % of the particles have a particle size less than 100 nm and particularly less than 68 nm or even 36 nm. However, this is not possible in all cases, and at a minimum, it is useful that at least 95 volume % of the pigment particles have a particle size less than 5000 nm.

Coating-Strength Dispersion Preparation

In general it is desirable to make the pigment dispersion in the form of a concentrated mill grind, which is subsequently diluted to the appropriate concentration and further processed if necessary for use in coating. This technique permits preparation of a greater quantity of pigment slurry from the equipment. If the mill grind was made in a solvent, it can be diluted with water or optionally other solvents to the appropriate concentration. If it was made in water, it can be diluted with either additional water or water-miscible solvents to the desired concentration. If the color filter requires a mixture of pigments, it is useful at this point to mix pigment dispersions that have been milled separately. By dilution or mixing, the pigment dispersion is adjusted to the desired viscosity, color, hue, saturation density, and area coverage for the particular application.

In the case of organic pigments, the coating dispersion can contain up to approximately 30% pigment by weight, but will generally be in the range of approximately 0.1 to 20%, and conveniently approximately 5 to 15%, by weight of the total dispersion composition for most color filter coating applications. If an inorganic pigment is selected, the dispersion will tend to contain higher weight percentages of pigment than with comparable dispersions employing organic pigments, and can be as high as approximately 75% in some cases, since inorganic pigments generally have higher specific gravities than organic pigments.

The amount of carrier medium is in the range of approximately 70 to 98 weight %, and conveniently approximately 80 to 95 weight %, based on the total weight of the dispersion. A mixture of water and a polyhydric alcohol, such as diethylene glycol, is useful as the aqueous carrier medium. In the case of a mixture of water and diethylene glycol, the carrier medium usually contains from about 30% water/70% diethylene glycol to about 95% water/5% diethylene glycol. Useful ratios are approximately 60% water/40% diethylene glycol to about 95% water/5% diethylene glycol. Percentages are based on the total weight of the carrier medium.

It can be desirable to add additional dispersant to the mixture. Useful dispersants have been described above.

The ability to coat a given surface can be affected by the surface tension of the coating-strength dispersion. Control of surface tensions is accomplished by additions of small amounts of surfactants. The level of surfactants to be used can be determined through simple trial and error experiments. Anionic, nonionic, and cationic surfactants can be selected from those disclosed in U.S. Pat. Nos. 5,324,349; 456,616 and 5,279,654 as well as many other surfactants. Commercial surfactants include the Surfynols® from Air Products; the Zonyls® from DuPont and the Fluorads® from 3M. A useful surfactant for these dispersions is Surfactant 10G from Dixie Chemical.

Coating of Pigments

To form color filters, pigments are often coated onto a substrate. For example, a color filter layer including the pigments can be coated onto any of a variety of rigid and non-rigid transparent or semi-transparent materials, such as glass or plastic. The substrate can be a substrate used solely for forming a color filter, which can be attached to a display device. In another embodiment, the substrate can have other uses as well. For example, a color filter layer or array of color filter layers can be coated onto the bottom of a bottom-emitting display device substrate. In yet another useful embodiment, the pigments can be coated over the top of an emitting layer that forms part of a display device. The display device can be an electronic display, such as an LCD display or an OLED display.

Any of a variety of well-known coating and printing techniques can be used to prepare a color filter from the coating-strength pigment dispersion. These techniques can include, but are not limited to, extrusion-type hopper (X-hopper) coating, spin coating, spray coating, ultrasonic spray coating, knife coating, and gravure coating. The dispersion can be aqueous or non-aqueous, but preferably non-aqueous. The coated dispersion is then typically permitted to dry to form a solid or semi-solid coating. Alternatively, the slurry can include for example, gelling materials or crosslinking monomers to produce a solid or semi-solid coating. The coating-strength pigment dispersion can include one or more photoresist compounds well-known in the art as useful for patterning color filters, e.g. in an array of colored pixels for an electronic display. In such a case, processing of the coated dispersion can include patterned exposure and post-exposure processing to form a patterned color filter.

The final color filter layers desirably comprise at least 10% color pigment, conveniently at least 25% color pigment, and usefully at least 50% color pigment by weight.

Fluorinated Phthalocyanine Pigments for Color Filters

A combination of two pigments is often required to achieve narrow filter spectral transmittance properties that can lead to the NTSC green chromaticity coordinates of $x=0.21$ and $y=0.71$ when cascaded with a light source. One known class of pigments having good transmittance in the green region and a maximum absorption at a wavelength within the range of from 600 to 700 nm is the metallophthalocyanines. Although commercially available metallophthalocyanine pigments such as pigment blue 15 (copper phthalocyanine) are well-known for their excellent lightfastness, they tend to be more blue than green in hue, and thus are less than optimal for use in a green color filter. Hydroxyaluminum phthalocyanine exhibits a greener hue than copper phthalocyanine, but suffers from relatively poor lightfastness. One class of pigments which display both excellent hue for the first pigment requirements and lightfastness are the so-called bridged aluminum phthalocyanines as described by Regan in U.S. Pat. No. 4,311,775, the contents of which are incorporated herein by reference. A particular example of a non-fluorinated siloxane-bridged aluminum phthalocyanine is bis(phthalocyanylalumino)tetraphenyldisiloxane.

A fluorinated phthalocyanine of the invention is defined as one containing a phthalocyanine group that is substituted directly by either fluorine or by perfluorinated groups. It does not refer to phthalocyanine molecules with fluorine or fluorine containing groups elsewhere in the molecule. For example, a fluoride ion or a perfluoroctanoxide group coordinated to the metal atom of a metallized phthalocyanine would not be a fluorinated phthalocyanine of the invention. The fluorinated phthalocyanine pigments of the invention are cyan or blue-green in color; that is, they have a maximum absorbance in the region of 600-700 nm.

The fluorinated phthalocyanines according to the invention are according to Formula (I):

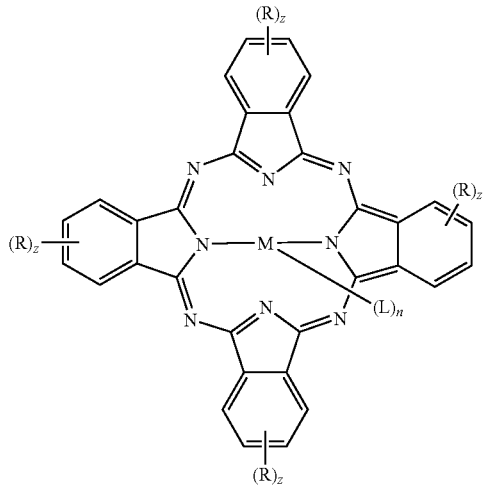

wherein:

M is a metal cation chosen from groups 2a, 3a, 1b-5b of the periodic table;

R is fluorine, a perfluoroalkyl or a perfluoroaryl group;

z is 1 to 4;

L is an anionic ligand; and n is 0 or 1 such that the overall charge on the molecular unit is neutral.

M is a metal cation chosen from Groups 2a, 3a, 1b-5b of the Periodic Table of the Elements so that the metal cation is at least divalent. The most suitable metal cations are $Cu^{+2}$ and $Al^{+3}$. Of these, $Al^{+3}$ is preferred.

R represents a fluoro, a perfluoroalkyl or a perfluoroaryl substituent on each of the four phenyl groups in the phthalocyanine ring system. Specific examples of perfluoroalkyl groups include trifluoromethyl, —$C_2F_5$ and —$C_8F_{17}$. A specific example of a perfluoroaryl group is pentafluorophenyl. Of these, fluoro and trifluoromethyl are preferred with fluoro being most preferred.

z represents the number of fluorine containing substituents on the phthalocyanine group and can range from 1 to 4 per phenyl group. It should be appreciated that when z=1, 2 or 3, there is a possibility of isomers where the substituents of each phenyl ring of the four total present in the phthalocyanine group may not be in the same relative position in every phenyl ring. One method of preparing a substituted phthalocyanine group is from a substituted phthalonitrile. Phthalonitrile and the subsequent portion of the phthalocyanine group derived from it have the following numbering system:

preferred with —O—Si(R)$_2$—O—Si(R)$_2$—O— and O—Si(R)$_2$—R—Si(R)$_2$—O— being most preferred. When L is a bridging ligand, the phthalocyanine units can be the same or different. When the phthalocyanine units are different, it is not necessary that both phthalocyanine units are fluorinated.

Preferred pigment types are those according to Formula (II):

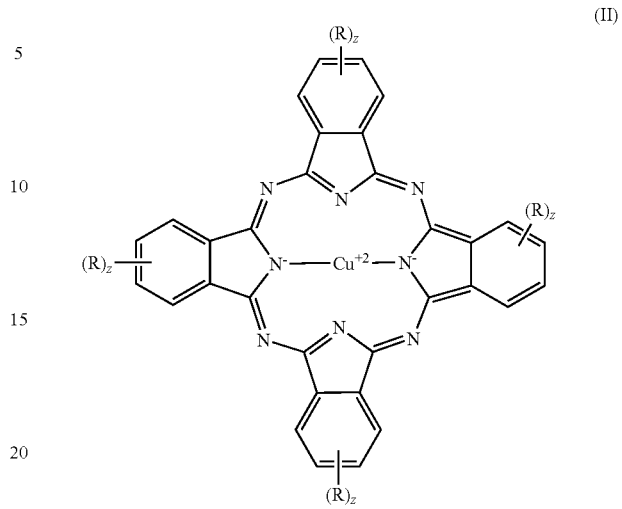

wherein R is fluoro or trifluoromethyl and z is 1-4. Of this type, the most preferred structures are where z is 1 and when R is fluoro.

Another preferred pigment type is those according to Formula (III):

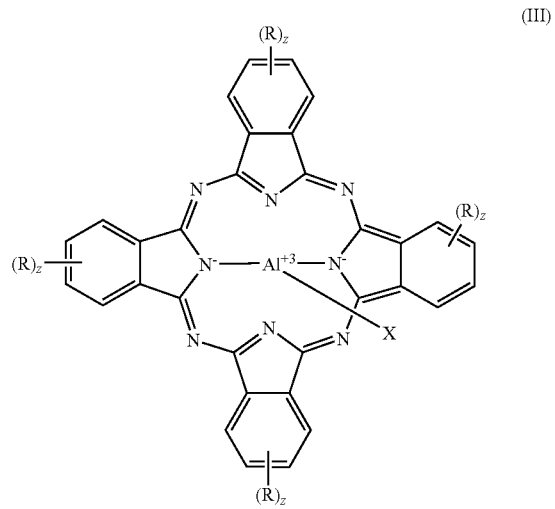

wherein R is fluoro or trifluoromethyl, z is 1-4 and X is a halide, hydroxide, —O— or —O—Si(R)$_2$—O—Si(R)$_2$—O— where the substituents on the Si atom are alkyl or aryl, particularly phenyl. Of these X groups, the bridging ligand —O—Si(R)$_2$—O—Si(R)$_2$—O— is highly preferred.

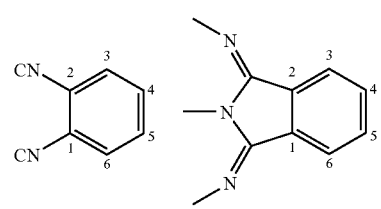

For example, pigments derived from either 3,6-difluorophthalocyanine or 4,5-difluorocyanine (z=2) will be symmetrical in terms of the phthalocyanine group and have only one isomer. However, pigments derived from 3,5-difluorophthalonitrile may not be symmetrical and isomers may arise since each individual phenyl group of the four in the phthalocyanine group may be substituted in either the 3,5 or the 4,6 positions. Whenever z=1-3, all possible individual isomers and mixtures of isomers in any combination are part of the invention.

One preferred pigment according to Formula (I) is where z=2 so that each phthalocyanine group has 8 substituents in all. However, the most preferred pigment according to Formula (I) is where z=1 where each phthalocyanine group has 4 substituents in all. The preferred substitution pattern for when z=1 is the 3- or 4-position as derived from 3-(substituted) phthalonitrile or 4-(substituted)phthalonitrile respectively. As above, all possible individual isomers and mixtures of isomers (in terms of fluorine location) in any combination are part of the invention.

L is an anionic ligand chosen so that the entire metallized phthalocyanine molecular unit is neutral. Phthalocyanine anions have a net −2 charge so that when the metal is divalent, the complex is neutral and no L is present (n=0). This is the case for when M is $Cu^{+2}$. When the metal is trivalent, one L is present and n=1. This is the case when M is $Al^{+3}$. Suitable monoanionic L groups include halides such as fluoride, chloride, bromide, hydroxide, phenoxide and thiophenoxide. L can also represent a bridging ligand that connects two independent phthalocyanine units. Suitable dianionic L groups include —O—, —OCH$_2$CH$_2$O—, —O—Si(R)$_2$—O—, —O—Si(R)$_2$—O—Si(R)$_2$—O—, —O—Si(R)$_2$—R—Si(R)$_2$—O— and —O—P(R)$_2$—O—P(R)$_2$—O— where R is alkyl or aryl, particularly phenyl. For all types of L, halo, hydroxide, —O—, —O—Si(R)$_2$—O—Si(R)$_2$—O—, and O—Si(R)$_2$—R—Si(R)$_2$—O— are Specific examples of inventive pigments include, but are not limited to, the following:

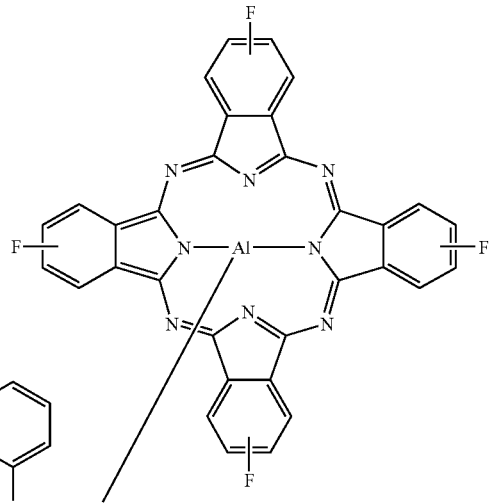

Inv-1

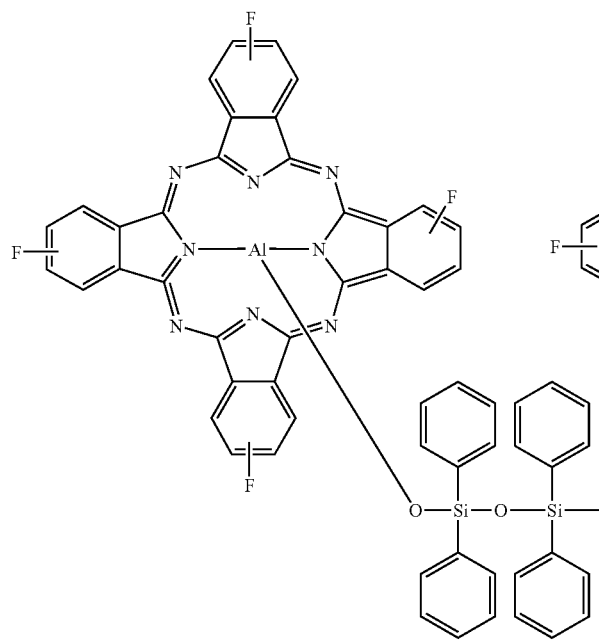

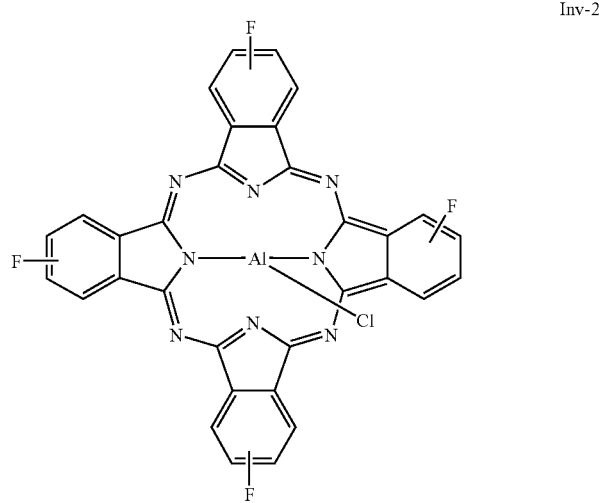

Inv-2

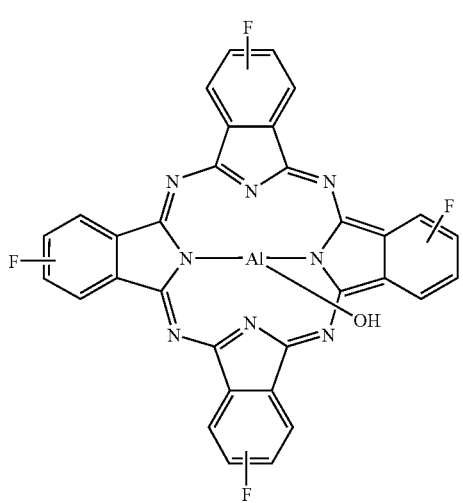

Inv-3

-continued
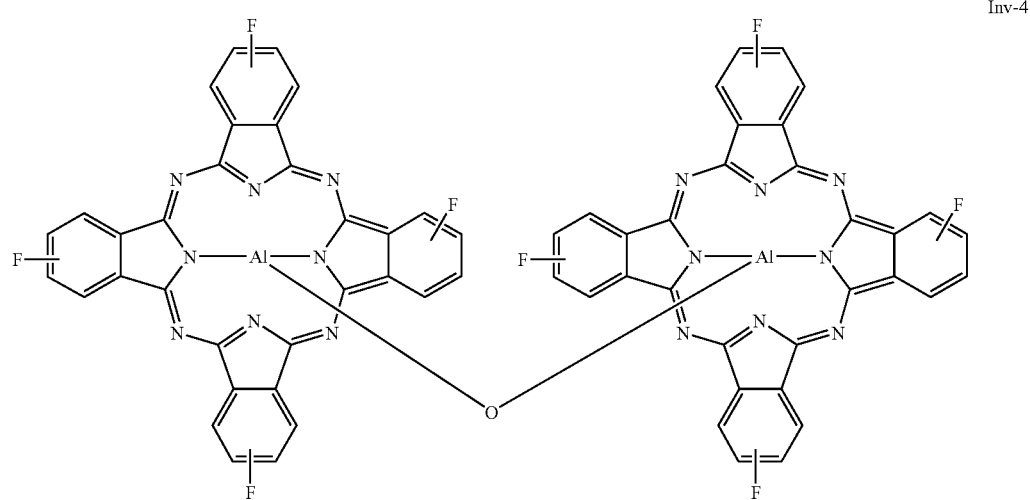
Inv-4
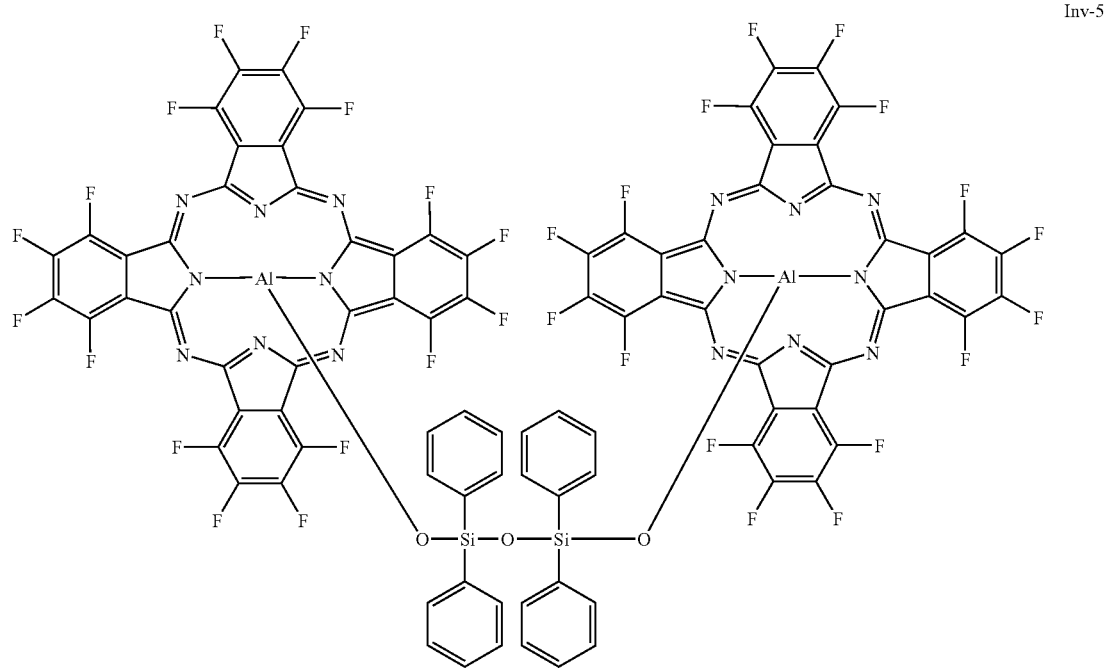
Inv-5

-continued
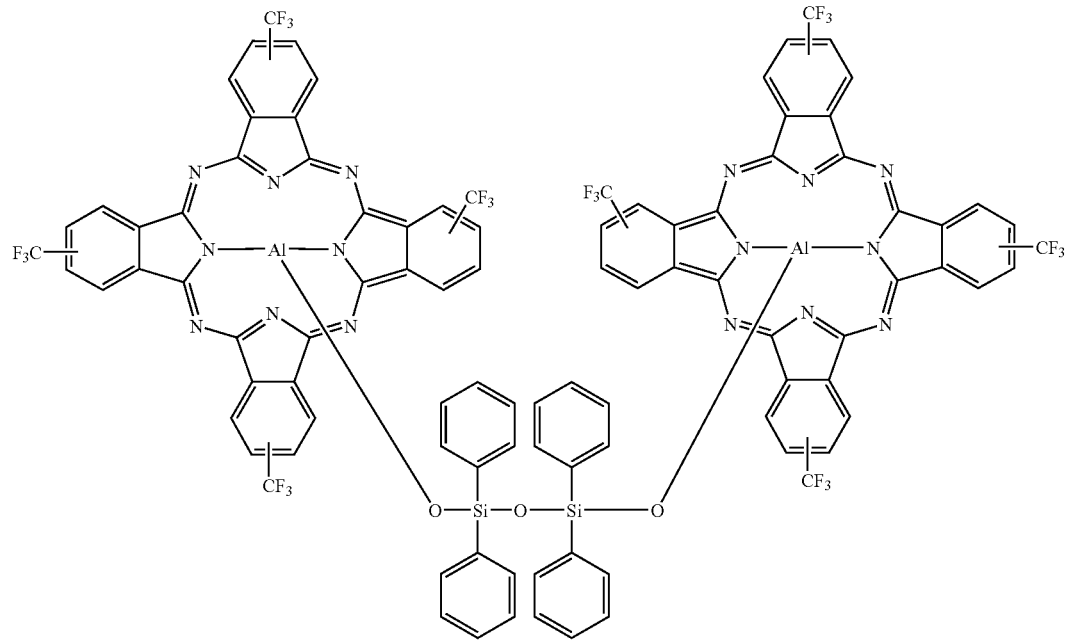
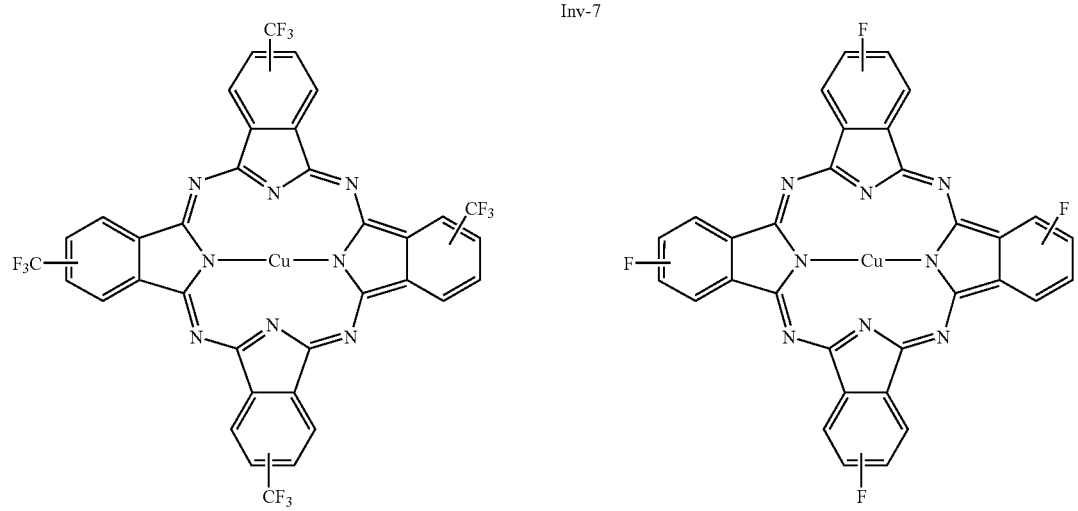
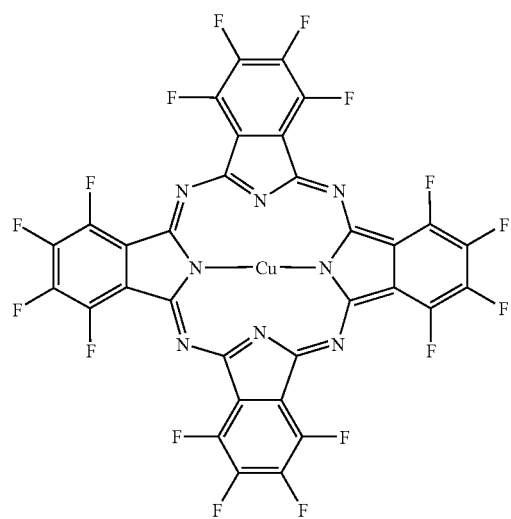

-continued
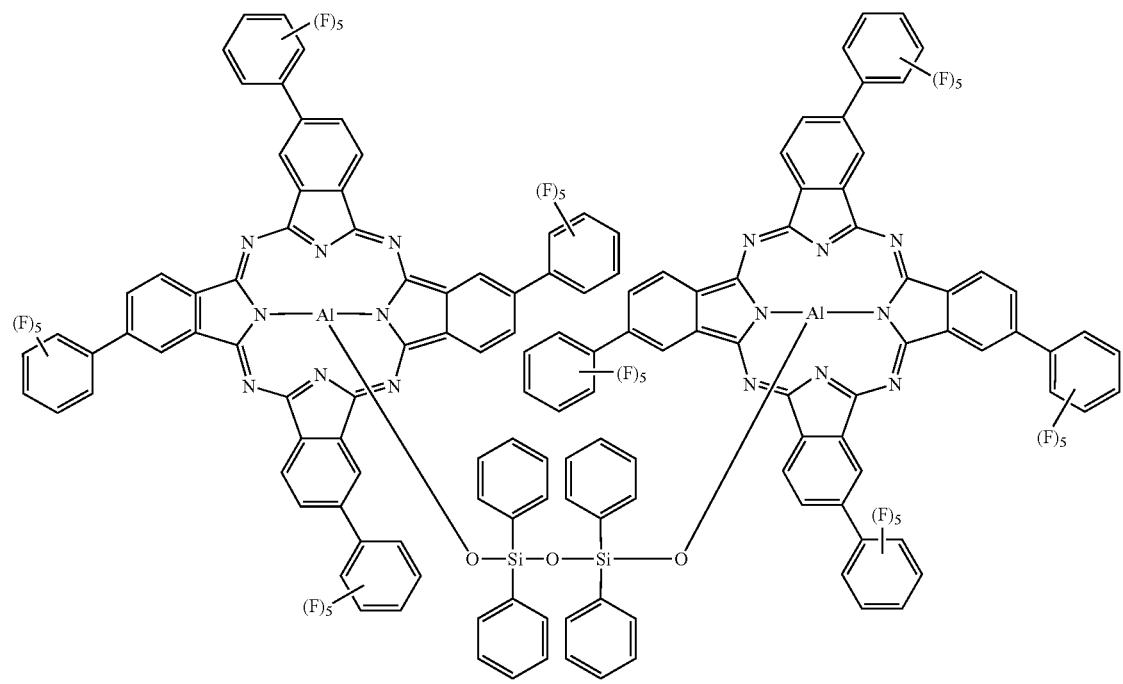
Inv-10
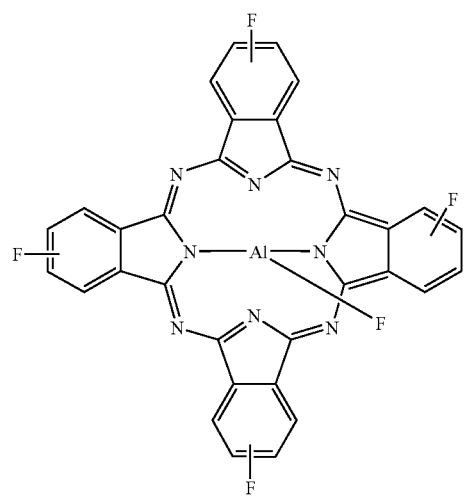
Inv-11

Mixtures of the fluorinated metal phthalocyanine can also be used in combination with other solid pigments during the milling step provided that the fluorinated metal phthalocyanine comprises at least 50 weight % of the mixture. Illustrative examples include other cyan or blue-green pigments, including non-fluorinated phthalocyanines such as copper phthalocyanine, or pigments with maximum absorbance of less than 620 nm such as Pigment Yellow 185. Preferably, the fluorinated phthalocyanine comprises at least 80%, or even 95%, by weight of the mixture.

Synthesis of a Fluorinated Phthalocyanine:

Inv-1 can be synthesized by the following scheme:

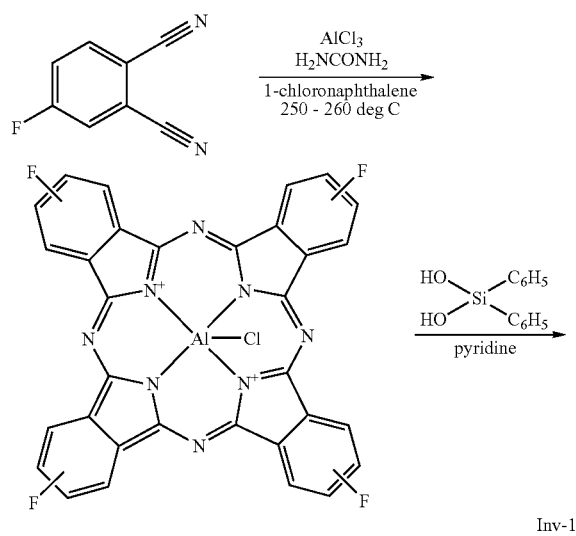

Preparation of Chloroaluminum Tetrafluorophthalocyanine

Into a 100 mL three neck round bottom flask was placed a magnetic stir bar, 20 grams 1-chloronaphthalene, 0.12 grams (2 mmoles) urea, 9.13 grams (62.5 mmoles) 4-fluorophthalonitrile, then 2.0 grams (15 mmoles) aluminum trichloride and finally 20 grams of 1-chloronaphthalene was used to wash the funnel. The flask was fitted with thermometer and condenser with nitrogen inlet. The reaction was heated with a heating mantle with continuous magnetic stirring. The reaction mixture gradually darkened until some blue-green color is noted at approximately 210 deg. C. At the temperature of 210 deg. C. the reaction became exothermic and rapidly heated to reflux at approximately 255 deg. C. with concomitant deep blue color formation. The reaction was held at 255 deg. C. for 3 hours. After this time a deep blue-black solid had formed and the reaction liquid was brownish which stirred freely. The reaction was cooled to 100 deg. C., then 60 mL of xylene was added and the reaction was stirred for 20 minutes. The mixture was filtered while still warm on a Buchner funnel through Whatman #54 filter paper and a blue-black precipitate was collected. This precipitate was washed with 50 mL of xylene then 100 mL of acetone. The filtrate was initially brownish but gradually changed to light blue. The collected solid was placed in a 250 mL erlenmyer flask, 50 mL of 5% aqueous NaOH was added and the mixture was stirred magnetically for 20 minutes rapidly. The insoluble material was collected on a Buchner funnel. The collected product was washed with 50 mL of acetone then 50 mL of ligroin, then dried on the Buchner funnel. The product was placed back in a 250 mL erlenmyer flask and 50 mL of 5% aqueous $NH_4OH$ was added. This solid is completely non-wetting, that is: the solid remains a completely dry powder on top of the colorless liquid and stirring does not wet the solid. The dry powder was collected on a Buchner funnel. The filtrate was totally colorless. The collected solid was washed with 50 mL of distilled water, 100 mL of acetone, then dried on the Buchner for 20 minutes. After transfer into a 250 mL erlenmyer flask 100 mL of acetone was added. The mixture was brought to boiling with stirring on a hot plate, held at boiling for 15 minutes, en filtered through Whatman #54 filter paper while hot. The filtrate is very light blue. The product was dried on the Buchner funnel for 15 minutes then dried in a vacuum oven at 60 deg. C. overnight. The weight of collected intermediate chloroaluminum tetrafluorophthalocyanine as a deep dark blue powder was 9.3 grams (14.3 mmoles, 95.9% yield). Melting point: >310 deg. C.

Preparation of Inv-1, Bis[tetrafluorophthalocyanylalumino]-1,1,3,3-tetraphenyl-1,3-disiloxane using diphenylsilanediol Into a 100 mL single neck round bottom flask was placed 5.4 grams (8.3 mmoles) chloroaluminum tetrafluorophthalocyanine, 35 mL pyridine and 1.9 grams (8.5 mmoles) diphenylsilanediol in that order. To the flask was added a magnetic stir bar, equipped with condenser and nitrogen inlet. The flask was placed in an oil bath pre-heated to 130 deg. C. The reaction was stirred and heated at reflux overnight. The chloroaluminum tetrafluorophthalocyanine appeared to dissolve partially in hot pyridine. After stirring overnight the reaction remained deep blue and freely stirring. The flask was removed from the oil bath, cooled to approximately 100 deg. C. and the insoluble product was collected on a Buchner funnel using Whatman #54 filter paper (filtered while hot). The collected blue product was washed with 4×50 mL pyridine until the washes were very light blue, then washed with 100 mL acetone, and 25 mL ligroin P950. The product was dried on the Buchner for one hour then dried in a vacuum oven f or one hour at 60 deg. C. The weight of deep blue product was 6.4 grams (3.9 mmoles, 94.3% of theory). Analysis by IR and MS showed small levels of starting material still in this isolated product. The crude product was then placed in a 250 mL erlenmyer flask and slurried with 125 mL dimethylformamide at reflux for 40 minutes. The insoluble material was collected on a Buchner funnel using Whatman #54 filter paper. The hot DMF slurry purification was repeated once. The final product was collected on a Buchner funnel, washed with 50 mL of acetone, and 25 mL of ligroin P950, and then dried in a vacuum oven at 10 deg. C. overnight. The collected weight of Inv-1 as a deep blue powder was 4.9 grams (2.99 mmoles, 72.2% of theory). The final product was analyzed by G C mass spectrometry, detecting 2.2% DMF (0.5 mol of DMF/mol of complex). These results were reproducible.

It should be noted that the fluorinated phthalocyanine pigments of the invention as synthesized may contain solvents (generally less than 10% by weight) that are either physically entrapped or in some cases coordinated as solute molecules. These small amounts of solvents generally do not affect dispersion preparation or performance.

Second Pigments for Color Filters:

The color filter of the invention contains at least one second pigment with a maximum absorbance less than 620 nm and is a different color from the fluorinated phthalocyanine. Since blue color filters should have maximum transmittance substantially in the range of 400 nm to 500 nm and the fluorinated phthalocyanine has low absorbance in the region of 500-600 nm, a suitable second pigment for a blue color filter should have a maximum absorbance in the region of 500-620 nm, preferably between 520-580 nm. An example of a useful second pigment for use in a blue color filter is Pigment Violet 23.

A useful green color filter according to this invention has good light transmittance in the green region of the spectrum (500 to 600 nm) and good light absorption in the red and blue regions of the spectrum. One useful embodiment of this green color filter has a fluorinated phthalocyanine pigment having good transmittance in the green region and a maximum absorption at a wavelength within the range of from 600 to 700 nm, and a second pigment having good transmittance in the green region and a maximum absorption at a wavelength within the range from 400 to 500 nm.

Fluorinated phthalocyanine pigments still have significant transmittance in the blue region. To be effective in a green filter, they are desirably combined with a second pigment having a maximum absorption at a wavelength within the range from 400 to 500 nm. One class of pigments that can be used is that which is commercially known as the monoazo yellow pigment classes, or more simply monoazo pigments. Useful yellow pigments include Pigment Yellow 138, Pigment Yellow 139, Pigment Yellow 180, Pigment Yellow 74, Pigment Yellow 185, Pigment Yellow 154 and mixtures thereof are preferred. Especially preferred are Pigment Yellow 185 and Pigment Yellow 74. Pigment numbers are as designated in the Color Index.

When pigment particles are prepared as described herein, useful ratios of the first pigment to the second pigment have been found to be in the range of 40:60 to 75:25 by weight. A color filter layer prepared from such dispersions can have good transmittance in the green region of the visible spectrum while having good absorption in other regions of the spectrum. The green filter layer so prepared can have a maximum transmittance of 60% or more at a wavelength of 520 nm, but of no more than 10% at a wavelength of 590 nm and of no more than 10% at a wavelength of 480 nm. The width at half-height of such a filter layer can be 80 nm or less. The width at half-height is defined as the width of the transmittance peak at one-half of the maximum transmittance. Such a filter layer has chromaticity coordinates (x,y) in the 1931 CIE XYZ colorimetric system, when calculated using CIE Standard Illuminant D65 or Standard Illuminant C, that satisfy the expressions $00.19 \leq x \leq 0.21$ and $0.69 \leq y \leq 0.71$. This is a very pure green color.

Dispersion Preparation

Preparation of Fluorinated Phthalocyanine Nanodispersion

Example 1

Figure 3A:
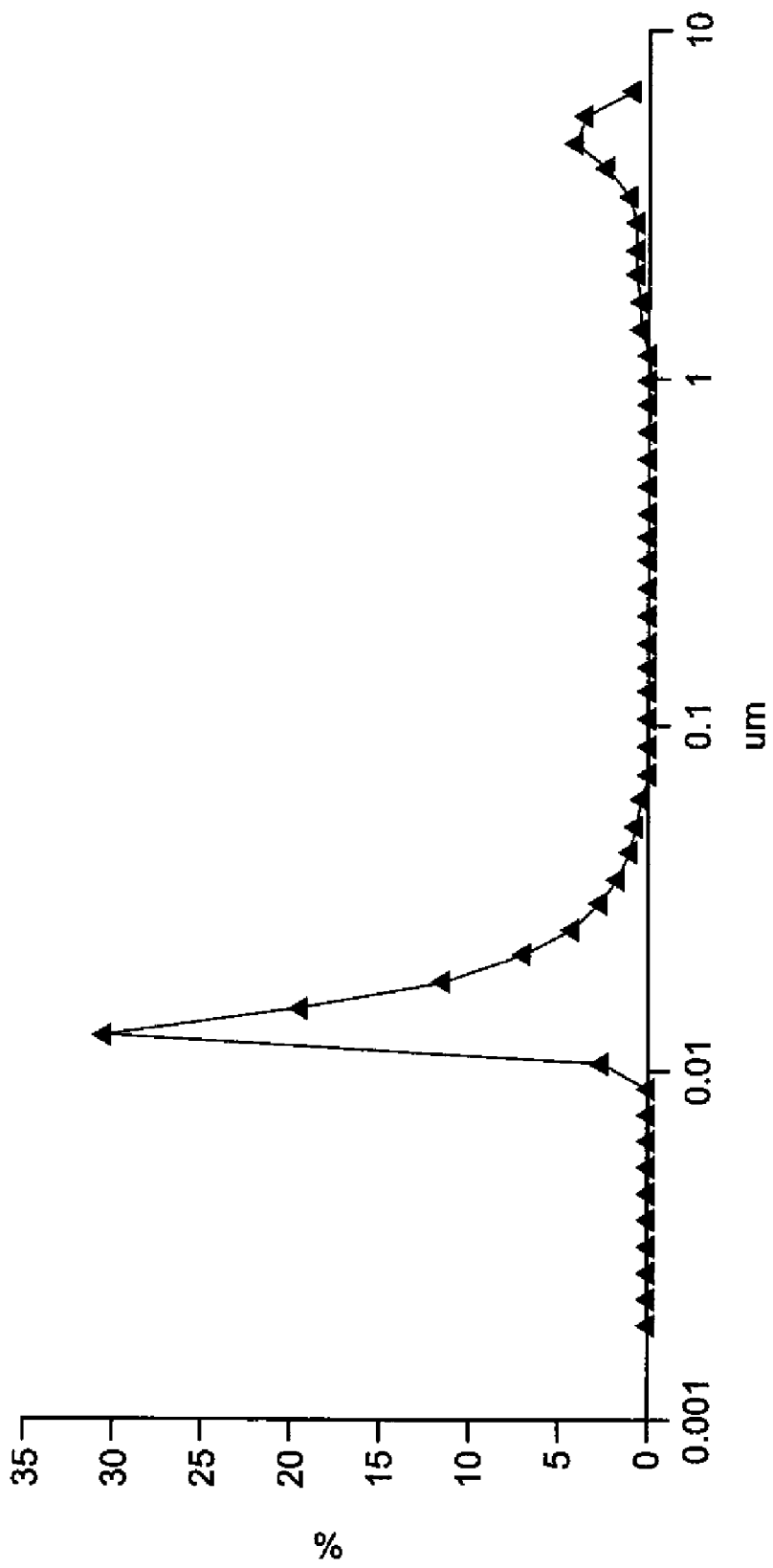
FIG. 3a shows the particle size distribution in terms of % of particles versus size for a fluorinated phthalocyanine of the invention.

To a 1 L stainless steel cold water jacketed vessel with a specially designed baffle, 244 g of a 1:1 (w/w) solvent mixture comprised of propylene glycol monomethyl ether acetate (PGMEA) and cyclohexanone was introduced along with 11.25 g of dispersant polymer Solsperse 41000. Then, a 50 mm diameter tool steel D blade connected to a vertical Caframo mechanical stirrer was submerged into the solvent. While operating the stirrer at 500 rpm, 45 g of Inv-1 was added followed by 600 g of 0.2 mm Zirstar (zirconium silicate milling media). The resulting dispersion was milled by gradually increasing the mixing rate starting with 18 h @1600 rpm, then ramping to 2800 rpm over 6 h, holding at 2800 rpm for 18 h and finishing with 5 h @3000 rpm. The dispersion was isolated after separation from the milling media by pressure filtration through a 20 micron filter. The particle distribution of the dispersed pigment was confirmed by using a dynamic light scattering sizing technique (FIG. 3a).

Preparation of Non Fluorinated Phthalocyanine Nanodispersion

Example 2

Figure 3B:
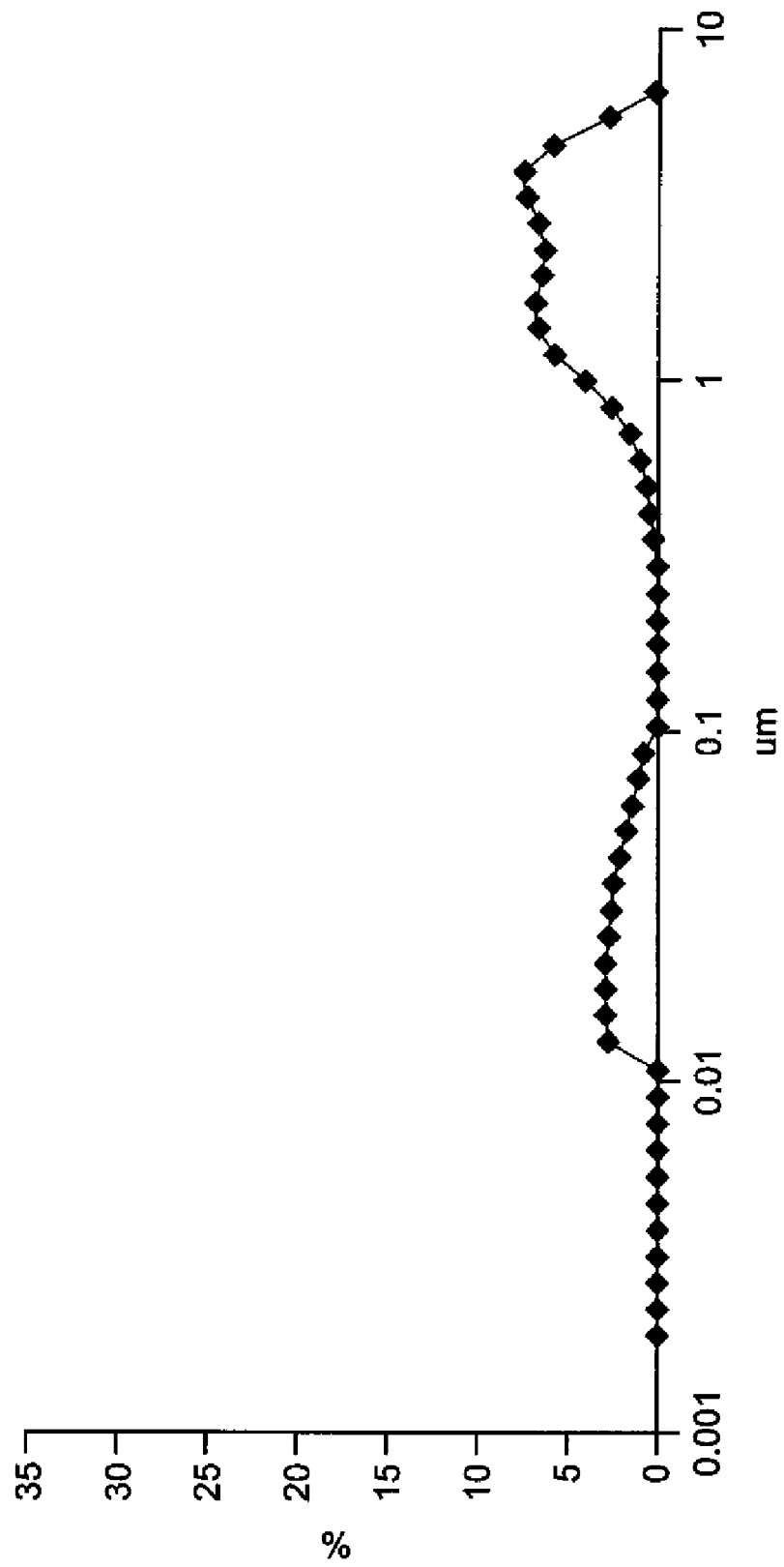
FIG. 3b shows the particle size distribution in terms of % of particles versus size for an analogous comparative non-fluorinated phthalocyanine.

The experiment was executed as outlined in Example 1 with the following exceptions; Inv-1 was replaced with the analogous non-fluorinated reference material bis(phthalocyanylalumino)tetraphenyldisiloxane and the starting 1600 rpm mixing rate was extended to 22 h. while omitting the 6 h ramp step before 18 h mixing @2800 rpm and the final 5 h @3000 rpm. The particle distribution is shown in FIG. 3b.

A comparison of the particle size distribution in terms of cumulative volume % below a certain size for Examples 1 and 2 are shown in Table 1.

TABLE 1

| | Cumulative % Below in Size | |
|---|---|---|
| nm | Example 1 | Example 2 |
| 6540 | 100.0 | 100.0 |
| 5500 | 99.3 | 99.9 |
| 4620 | 95.4 | 97.3 |
| 3890 | 91.1 | 91.4 |
| 3270 | 88.6 | 83.8 |
| 2750 | 87.4 | 76.5 |
| 2310 | 86.6 | 69.8 |
| 1940 | 85.8 | 63.4 |
| 1640 | 85.2 | 56.8 |
| 1380 | 84.6 | 50.0 |
| 1160 | 0.0 | 43.4 |
| 970 | 0.0 | 37.8 |
| 820 | 0.0 | 33.7 |
| 690 | 0.0 | 31.0 |
| 580 | 0.0 | 29.4 |
| 490 | 0.0 | 28.4 |
| 410 | 0.0 | 27.7 |
| 340 | 0.0 | 27.1 |
| 290 | 0.0 | 0.0 |
| 240 | 0.0 | 0.0 |
| 200 | 0.0 | 0.0 |
| 170 | 0.0 | 0.0 |
| 140 | 0.0 | 0.0 |
| 120 | 0.0 | 0.0 |
| 100 | 0.0 | 0.0 |
| 86 | 0.0 | 26.8 |
| 72 | 0.0 | 26.0 |
| 68 | 84.0 | 24.9 |
| 51 | 83.4 | 23.4 |
| 43 | 82.6 | 21.5 |
| 36 | 81.4 | 19.3 |
| 30 | 79.6 | 16.9 |
| 26 | 76.8 | 14.3 |
| 22 | 72.4 | 11.5 |
| 18 | 65.3 | 8.6 |
| 15 | 53.5 | 5.7 |
| 13 | 33.8 | 2.7 |
| 11 | 2.8 | 0.0 |
| 9 | 0.0 | 0.0 |

Preparation of Pigment Yellow 185 Dispersions

Example 3

Yellow Dispersion used to Make Green Filters

The solvent PGMEA (545 g) was combined with dispersant polymer Disperbyk 161 (31.5 g solution w/4.5% active polymer) in a 2.0 L stainless steel cold water jacketed vessel with no baffle. A 70 mm diameter high-shear Cowles disperser blade connected to a Ross mechanical stirrer (Model HSM-100H2) was submerged and the stirrer set to 500 rpm. While in operation, 50.4 g of Pigment Yellow 185 was introduced followed by 700 g of 50-micron milling media composed of crosslinked polystyrene divinyl benzene. The dispersion was milled by gradually increasing the mixing rate; 1.5 h @1000 rpm, 16 h @1100 rpm, and 3 h @1200 rpm. The dispersion was isolated from the milling media by pressure filtration through a 5 micron filter.

In a preferred process, a baffled vessel is used, the pigment to polymer ratio is 1:0.5 and the milling time is reduced to 2 h.

Green Filter Preparation

Inventive Green Filter: A sample of the fluorinated phthalocyanine nanodispersion from Example 1 was transferred into a glass bottle. Then, the Pigment Yellow 185 dispersion from Example 3 was added to obtain a pigment ratio of 0.95 to 1.0 respectively. The bottle was sealed with a cap and the contents manually shaken until the dispersions were completely mixed.

A thin-film of the green dispersion was spin-coated onto the surface of a glass plate previously cleaned using standard glass cleaning techniques. The spin-coating parameters were set to achieve film thicknesses between 1.5 and 2.0 microns. Spectral and thickness measurements were taken towards the center of the glass plate.

Figure 4:
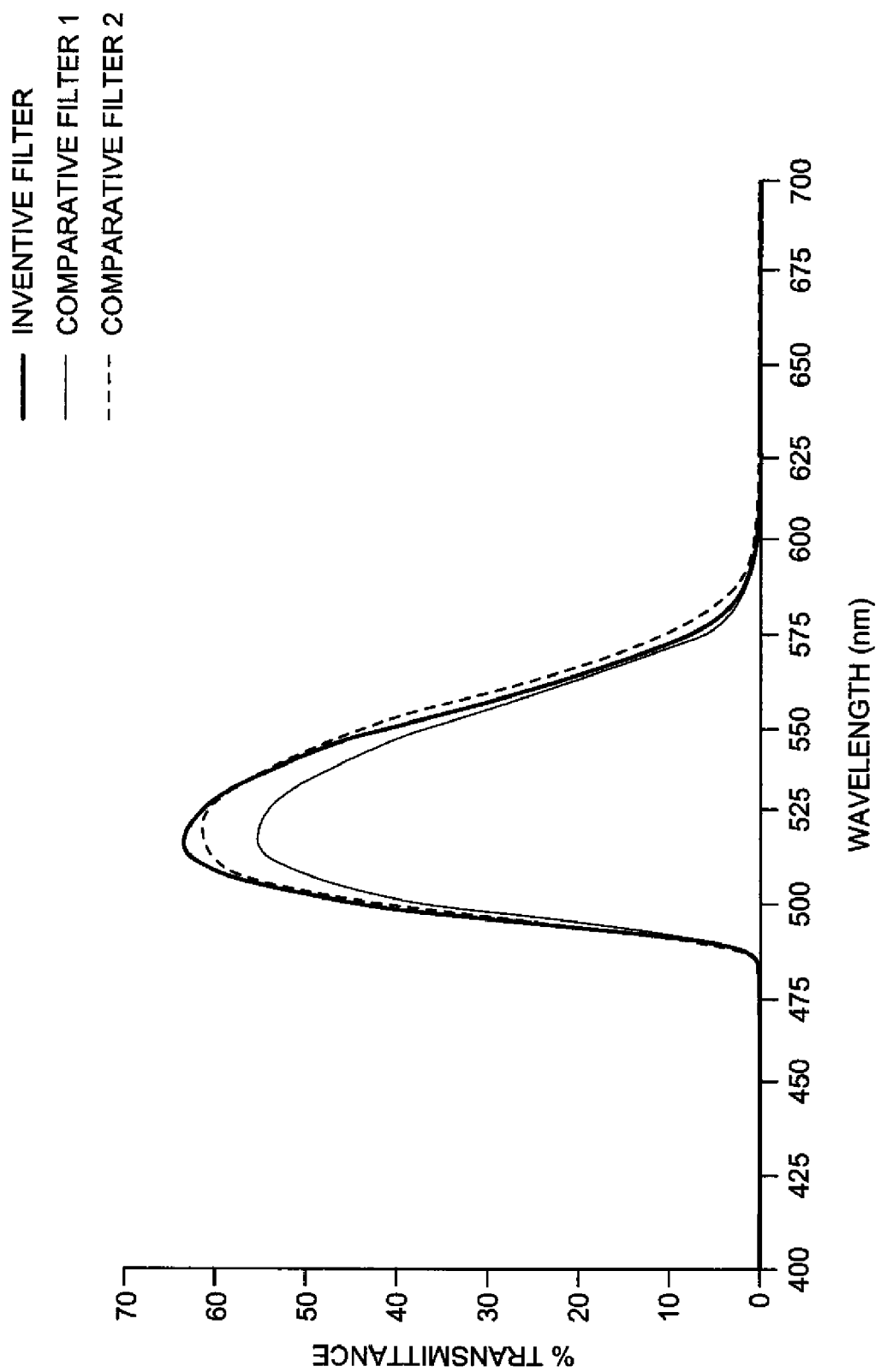
FIG. 4 shows the % transmittance versus wavelength for inventive and comparative green filters.

Comparative Green Filters 1 and 2: the cyan dispersion prepared in Example 2 was combined in a bottle with the Pigment Yellow 185 dispersion from Example 3 to achieve a pigment ratio of 1.24 to 1.0 respectively. The bottle was sealed with a cap and the contents manually shaken until the dispersions were completely mixed. A thin-film of the green dispersion was spin-coated onto the surface of a glass plate previously cleaned using standard glass cleaning techniques. The spin-coating parameters were set to achieve film thicknesses between 1.5 and 2.0 microns. Total spectral transmittance and thickness measurements were taken towards the center of the glass plate (Comparative Green Filter 1). For Comparative Green Filter 2, the same coating from Comparative Filter 1 was used, however, total spectral transmittance and thickness measurements were taken towards the edge of the glass plate. FIG. 4 shows the % transmittance versus wavelength for these inventive and comparative green filters and is tabulated in Tables 2 and 3.

TABLE 2

Green Filter Performance

| Green Filter | Peak Transmittance | % Peak Transmittance Change from Comp 1 | Bandwidth @ ½ Peak Transmittance | Nominal Filter Thickness (microns) |
|---|---|---|---|---|
| Inventive | 60.9% (517 nm) | +14.7% | 59 nm | 1.8 |
| Comp 1 | 53.1% (520 nm) | control | 59 nm | 1.8 |
| Comp 2 | 59.0% (521 nm) | +11.1% | 63 nm | 1.5 |

TABLE 3

% Total Spectral Transmittance

| Wavelength | Inventive | Comp 1 | Comp 2 |
|---|---|---|---|
| 480 nm | 0.03 | 0.04 | 0.08 |
| 520 nm | 60.7 | 53.1 | 58.9 |
| 590 nm | 1.5 | 1.1 | 2.2 |

A summary of the performances for Inventive and Comparative green filters is outlined in Tables 2 and 3. The data show that the Inventive Filter and Comparative Filter 1 have comparable bandwidths at ½ peak transmittance and a low transmittance in the 480 and 590 nm wavelength regions. However, the Inventive Filter provides a higher peak transmittance by 14.7%. The improved % T can be attributed to the superior nano-scale particle distribution afforded by Inv-1. Data collected for Comparative Filter 2 demonstrates that a thinner filter improves the % Transmittance to a position closer to the Inventive Filter, which is 11.1% higher in peak transmittance than Comparative Filter 1, but its bandwidth at half peak transmittance is broader by about 4 nm on the bathochromic side. This increase in breadth is undesirable because it leads to a less favorable chromaticity position as described in Table 4 below.

The aim is to achieve the x,y chromaticity coordinates of the NTSC green primary when the green filters are cascaded with CIE Standard Illuminant C and the 1931 CIE color matching functions. Table 4 shows the resulting chromaticity coordinates after cascading the Inventive and both Comparative Filters with CIE Standard Illuminant C and the 1931 CIE color matching functions. The resulting CIE chromaticity coordinates for the Inventive Filter are essentially equal to those of the target NTSC green primary and very similar to those for Comparative Filter 1. The x,y delta values show that the chromaticity coordinates of the thinner Comparative Filter 2 are farther away from those of the target NTSC green primary and Comparative Filter 1. Thus thinning Comparative Filter 1 to get a percent transmittance closer to that of the Inventive Filter compromised the chromaticity coordinate position away from the target NTSC green primary position.

TABLE 4

Green Filter Color Performance

| Filter or Primary: | Inventive Filter | Comparative Filter 1 | Comparative Filter 2 | NTSC Green Primary |
|---|---|---|---|---|
| 1931 CIE x, y (Std. Ill. C) | 0.2032, 0.7063 | 0.2029, 0.7086 | 0.2148, 0.6971 | 0.21, 0.71 |
| Delta CIE x, y from NTSC Primary (C) | 0.0077 | 0.0072 | 0.0138 | 0 |
| % Luminance Relative to Comparative Filter 1 | +15.4% | 0% | +20.1% | Not Applicable |

The percent transmittance advantage of the Inventive Filter over Comparative Filter 1 translates directly into a luminance advantage of about 15% at essentially the same chromaticity position. The luminance advantage of 15% holds true for white light sources other than CIE Standard Illuminant C. CIE Standard Illuminant D65, a broadband-emitting OLED display device, or a CCFL for an LCD are all light sources that when cascaded with the Inventive Filter give a 15% luminance advantage over Comparative Filter 1 at roughly equal chromaticity. Comparative Filter 2, which results from a thinner film coating of the Comparative Filter 1 formulation, can produce a 20% luminance advantage over Comparative Filter 1 when cascaded with CIE Standard Illuminant C. However, this increased luminance over Comparative Filter 1 and the Inventive Filter (by 5%) comes at the price of chromaticity coordinates that are not equal to the NTSC green primary target, as seen by the high x,y delta for the thinning Comparative Filter 2. Thus, thinning the film thickness results in raising the luminance while compromising the chromaticity position.

The invention has been described in detail with particular reference to certain preferred embodiments thereof, but it will be understood that variations and modifications can be effected within the spirit and scope of the invention.

The patents and other publications referred to herein are incorporated herein by reference.

PARTS LIST 10 electronic display
15 electronic display
20a group of pixels
20b group of pixels
21a pixel
21b pixel
21c pixel
21d pixel
25a red color filter
25b green color filter
25c blue color filter
30a anode
30b anode
30c anode
35 hole-injecting layer
40 hole-transporting layer
45 light-emitting layer
50 light-emitting layer
55 electron-transporting layer
60 electron-injecting layer
70 organic EL element
80 OLED substrate
85 filter substrate
90 cathode

The invention claimed is:

1. A color filter for an electronic display device having a green color filter layer comprising a fluorinated phthalocyanine pigment having a maximum absorbance between 600-700 nm and at least one second pigment with a maximum absorbance between 400-500 nm and having a transmittance of 60% or more at a wavelength of 520 nm, of no more than 10% at a wavelength of 590 nm, and of no more than 10% at a wavelength of 480 nm, wherein the fluorinated phthalocyanine pigment is according to Formula (I):

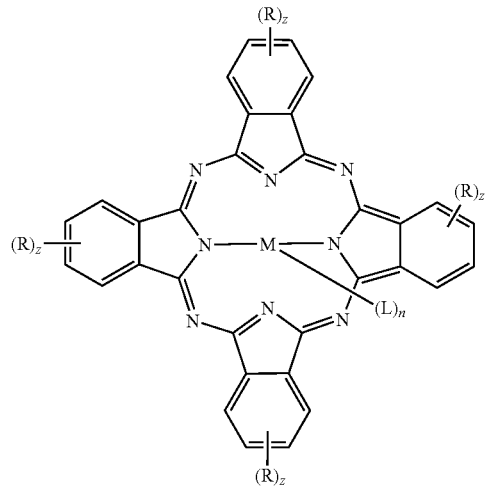

M is aluminum;
R consists of one of fluorine, a perfluoroalkyl or a perfluoroaryl group;
z is 1 to 4;
L is a bridging ligand chosen from —O—, —O—Si($R^1$)$_2$—O—Si($R^1$)$_2$—O— or, —O—Si($R^1$)$_2$—$R^1$—Si($R^1$)$_2$—O— where $R^1$ is alkyl or phenyl; and
n is 1 such that the overall charge on the molecular unit is neutral, and
wherein at least 85 volume percent of the fluorinated phthalocyanine pigment has a particle size less than 2750 nm.

2. The color filter of claim 1 where z is 1.

3. The color filter of claim 1 where R is fluoro.

4. The green color filter of claim 1 wherein the second pigment is a monoazo pigment.

5. The green color filter of claim 4 wherein the second pigment is Pigment Yellow 185.

6. The color filter of claim 1 wherein the filter layer comprises a fluorinated phthalocyanine pigment wherein at least 80 volume percent of the pigment particles have a particle size less than 100 nm.

7. The color filter of claim 1 wherein the pigment particles of the fluorinated phthalocyanine are produced using non-aqueous organic solvents.

8. The green color filter of claim 1 wherein the green filter layer has chromaticity coordinates (x,y) in the 1931 CIE XYZ colorimetric system, calculated using CIE Standard Illuminant C, that satisfies the expressions $0.19 \leq x \leq 0.21$ and $0.69 \leq y \leq 0.71$.

9. The green color filter of claim 8 that has greater % luminance at the same chromaticity coordinates than a green color filter prepared in identical manner using the analogous non-fluorinated phthalocyanine pigment.

10. An electronic display device comprising the color filter of claim 1.

11. The display device of claim 10 wherein the display device is an OLED device.

12. A color filter having a filter layer comprising only one fluorinated aluminum phthalocyanine pigment with a bridging ligand having a maximum absorbance between 600-700 nm and at least one second pigment with a maximum absorbance between 400-500 nm and having a transmittance of 60% or more at a wavelength of 520 nm, of no more than 10% at a wavelength of 590 nm, and of no more than 10% at a wavelength of 480 nm, wherein the fluorinated phthalocyanine is a phthalocyanine group that is substituted directly by either fluorine or by perfluorinated groups.

* * * * *